(12) United States Patent
Yamada et al.

(10) Patent No.: US 6,392,953 B2
(45) Date of Patent: May 21, 2002

(54) SEMICONDUCTOR MEMORY

(75) Inventors: Toshio Yamada, Shiga; Akinori Shibayama, Kyoto, both of (JP)

(73) Assignee: Matsushita Electronics Corporation, Osaka (JP)

(*) Notice: Subject to any disclaimer, the term of this patent is extended or adjusted under 35 U.S.C. 154(b) by 0 days.

(21) Appl. No.: 09/875,960

(22) Filed: Jun. 8, 2001

Related U.S. Application Data

(62) Division of application No. 09/523,205, filed on Mar. 10, 2000, now abandoned, which is a division of application No. 08/972,444, filed on Nov. 18, 1997, now Pat. No. 6,091,655.

(30) Foreign Application Priority Data

Nov. 19, 1996 (JP) .............................................. 8-308280
Jun. 24, 1997 (JP) .............................................. 9-167630

(51) Int. Cl.$^7$ ................................................ G11C 8/00
(52) U.S. Cl. ............................. 365/230.03; 365/189.12
(58) Field of Search ....................... 365/230.03, 189.12, 365/189.01, 207

(56) References Cited

U.S. PATENT DOCUMENTS

| | | |
|---|---|---|
| 4,363,111 A | 12/1982 | Heightley et al. |
| 4,504,929 A | 3/1985 | Takamae et al. |
| 4,669,065 A | 5/1987 | Ohsawa |
| 4,961,166 A | 10/1990 | Sato et al. |
| 5,301,157 A | 4/1994 | Roberts |
| 5,392,240 A | 2/1995 | Muraoka |
| 5,406,510 A | 4/1995 | Mihara et al. |
| 5,561,627 A * | 10/1996 | Matsubara et al. .... 365/185.04 |
| 5,717,640 A | 2/1998 | Hashimoto |
| 5,768,202 A | 6/1998 | Raad |
| 5,831,900 A * | 11/1998 | Miyamoto ............. 365/185.03 |
| 5,912,853 A | 6/1999 | Rao |
| 5,936,906 A | 8/1999 | Tsen |
| 5,949,722 A | 9/1999 | Liu et al. |

FOREIGN PATENT DOCUMENTS

JP 05266692 10/1993

* cited by examiner

*Primary Examiner*—Son T. Dinh
(74) *Attorney, Agent, or Firm*—McDermott, Will & Emery

(57) ABSTRACT

A plurality of information memory cells and a single reference memory cell are coupled to a single word line. The reference memory cell stores reference information equivalent to a reference potential to information readout. Pieces of information, stored in the information memory cells, are fed, over respective bit lines, to first input terminals of sense amplifiers. The reference information, stored in the reference memory cell, is fed, over a bit line, to second input terminals of the sense amplifiers. When the potential of signal charges stored in the information memory cells falls due to leakage current, the potential of a signal charge stored in the reference memory cell correspondingly falls due to leakage current. This prolongs a length of time taken for a difference between these potentials to reach a sense limit, thereby achieving a longer data retention time. As a result of such arrangement, even when there occurs a small current leakage from memory cells, it is possible to secure a long data retention time thereby making it possible to obtain a long refresh cycle period.

4 Claims, 28 Drawing Sheets

Fig. 7

| CONTENTS OF CONTROL | | t1 PRECHARGE | t2 CELL READOUT | t3 PROBE TRANSISTOR READOUT | t4 PREAMPLIFIER READOUT | t5 SENSE AMPLIFIER ACTIVATION | REWRITE | t6 PRECHARGE |
|---|---|---|---|---|---|---|---|---|
| BITLINE PRECHARGE | N11, N21 | ON | OFF | OFF | OFF | OFF | OFF | ON |
| PROBE READOUT | N13, N23 | OFF | OFF | ON | ON | ON | ON | OFF |
| BITLINE WRITE | N1W, N2W | OFF | OFF | OFF | OFF | OFF | ON | OFF |
| GLOBAL BIT PRECHARGE | N14, N24 | ON ↓ OFF | OFF | OFF | OFF | OFF | OFF | OFF |
| PREAMPLIFIER PRECHARGE | N15, N25 | ON | OFF | OFF | OFF | OFF | OFF | ON |
| SENSE AMPLIFIER INPUT PRECHARGE | P12, P22 | ON | ON | OFF | OFF | OFF | OFF | ON |
| PREAMPLIFIER READOUT | P13, P23 | OFF | OFF | OFF | ON | ON | OFF | OFF |
| SENSE AMPLIFIER READ-IN | N18, N19 | ON | ON | ON | ON | ON | OFF | ON |
| SENSE AMPLIFIER PRECHARGE | N1c, N1d, N1e | ON | ON | OFF | OFF | OFF | OFF | ON |
| SENSE AMPLIFIER DRIVE | VSP | Low | Low | Low | Low | Hi | Hi | Low |

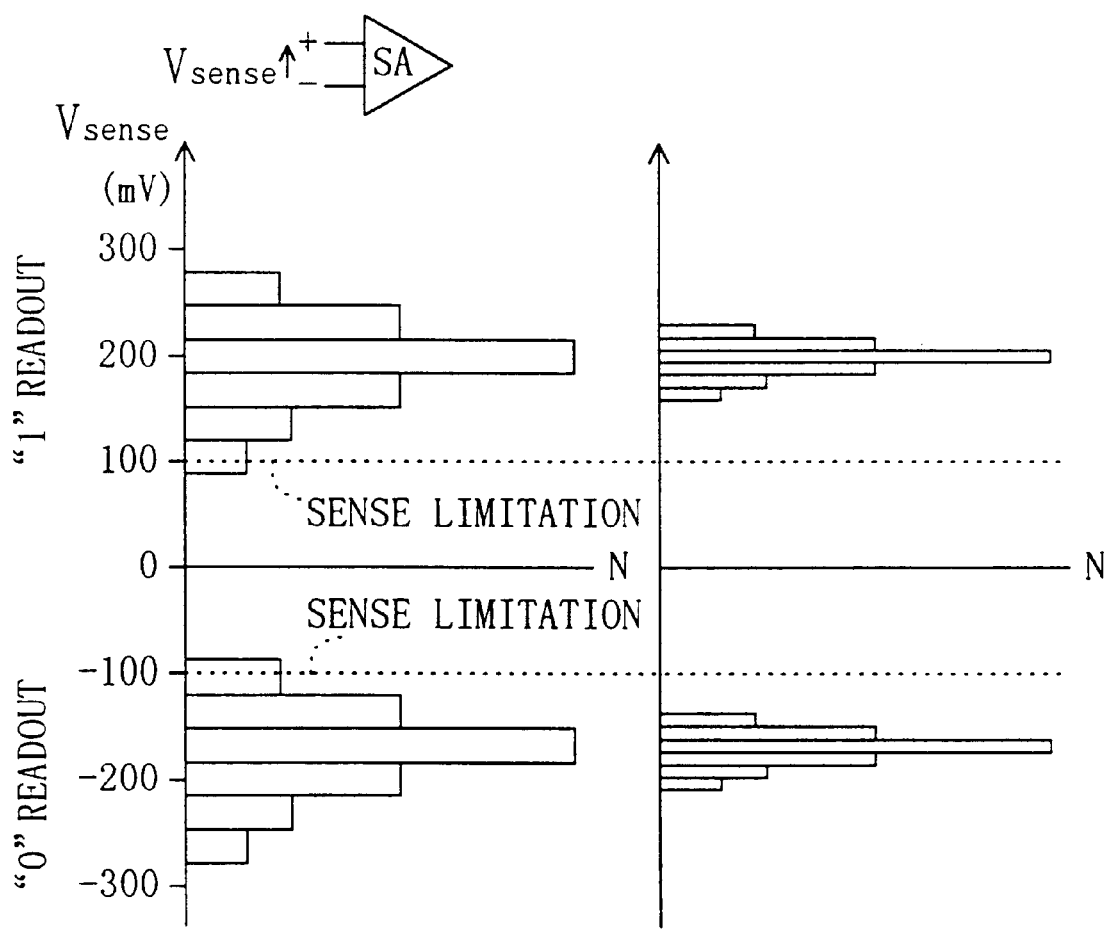

83 DATE BUS

DESKTOP TYPE    NOTE TYPE

SEMICONDUCTOR MEMORY

This application is a division of Ser. No. 09/523,205 filed Mar. 10, 2000, now abandoned, which is a division of Ser. No. 08/972,444 filed Nov. 18, 1997 now patent number 6,091,655.

BACKGROUND OF THE PRESENT INVENTION

The present invention generally relates to the field of semiconductor memories. More particularly, the present invention relates to a DRAM and a memory core utilizable in embedded memories including DRAMs (dynamic random access memories) and logical circuits.

The level of integration of memories, particularly the level of DRAM integration, has been improved increasingly year by year. In order to avoid a reduction of the serviceable time of memories, a longer refresh cycle period is required. The level of real performance values required for data retention times becomes higher. It seems hard for process devices to meet such requirements.

Referring now to FIG. 23, the value of real performance of the memory data retention time will be described.

FIG. 23 outlines a conventional DRAM. Cs is a storage capacitor in a DRAM memory cell. WL1 and WL2 are word lines. bit is a bit line and xbit is a bit line in complementary relationship with the bit line bit. Vpre is a bit line precharge voltage. Ppre is a precharge control line. SA is a sense amplifier.

The operation of the DRAM is briefly explained. The precharge control line Ppre first enters the high level state and the bit lines bit and xbit are set at the precharge level Vpre. Subsequently, the precharge control line Ppre enters the low level state. This is followed by an increase in the potential of the word line WL1 and a micropotential is produced by a signal charge, stored in the memory cell storage capacitor Cs, in the bit line bit. This micropotential produced is subjected to amplification processing in the sense amplifier SA.

If a potential just before the word line WL1 undergoes an increase in potential, stored in the memory cell storage capacitor Cs, is Vcs, then a conservation of charge before and after a cell transistor conducts can be written by:

$$Cs(Vcs-Vplate)+Vpre*CB=Cs(Vr'-Vplate)+Vr'*CB$$

where Vplate is the cell plate potential, CB is the capacitance of the bit lines bit and xbit, and Vr' is the bit line potential determined after an electric charge is read out from the memory cell.

From this equation, a microvoltage Delta $-V$ to be amplified in the sense amplifier SA is expressed by:

$$Delta\ -V=Vr'-Vpre=a*(Vcs-Vpre)$$

$$a=Cs/(Cs+CB)$$

Only when the microvoltage Delta $-V$ exceeds the sensitivity limit of the sense amplifier SA (+−Vsa), data are read out correctly. For example, if a "1" is written and is then read out, this produces a voltage expressed by:

$$Delta\ -V=a*(Vdd-Vpre)=0.2*(3.3-1.65)=330\ mV$$

where Vdd is the supply voltage. On the other hand, if a "0" is written and is then read out, this produces a potential that may be expressed by:

$$Delta\ -V=a*(0-Vpre)=0.2*(0-1.65)=-330\ mV$$

Here, a=0.2, Vdd=3.3 V, and Vpre=Vdd/2.

Usually, the sense amplifier's sensitivity limit Vsa is about 50 mV. The DRAM operates normally without problems.

Next, consider a case in which there occurs a leakage current from the memory cell storage capacitor Cs therefore producing a difference between a voltage written to Cs and a voltage read out from Cs. For instance, suppose here a case of writing a "1", wherein a malfunction occurs at the time when the level of voltage reduces down to Vcs1L. It follows from $a*(Vcs1L-Vpre)=Vsa$ that $0.2*(Vcs1L-1.65)=0.05$. This shows that the malfunction starts occurring when Vcs1L=1.9 V. A length of time up to the time such a limit is reached is a real performance value of the data retention time. This relationship is illustrated by reference to FIG. 24.

SUMMARY OF THE PRESENT INVENTION

Accordingly, an object of the present invention is to provide a longer data retention time for the realization of a longer refresh cycle period. Another object of the present invention is to prevent poor yields caused by short data retention times to achieve a reduction of the entire process cost.

In order to accomplish these objects, the reference potential in sense amplifiers is decreased corresponding to the decrease of voltage due to leakage current in memory cells.

The present invention provides a semiconductor memory comprising:

an information memory cell of a capacitor and a transistor for performing operations of reading out information;

a word line for accessing the memory cell; and a reference memory cell other than the information memory cell, the reference memory cell being coupled to the word line or to a word line having the same address as the word line;

wherein the reference memory cell stores information for use by a sense amplifier, the information being reference information equivalent to a reference potential to the reading of information from the information memory cell.

In the semiconductor memory it is preferred that the number of information memory cells is greater than the number of reference memory cells by one or more.

In one embodiment the number of reference memory cells is two, these two reference memory cells storing information of 1 and information of 0, respectively, and that the semiconductor memory further comprises a reference potential generation circuit capable of generating, based on the information stored in the two reference memory cells, a reference potential.

In another embodiment three or more information memory cells and three or more reference memory cells each store multi-bit information are utilized and the semiconductor memory further comprises a reference potential generation circuit capable of generating, based on the multi-bit information stored in the reference memory cells, a reference potential.

In a further embodiment a first memory cell group composed of information memory cells is divided into two approximately equal subgroups and a second memory cell group composed of reference memory cells for storing reference information is placed between the subgroups.

In accordance with the present invention, the reference potential stored in a memory cell different from an information memory cell is designed to fall corresponding to a decrease in potential of the information memory cell due to a leakage of the signal charge, whereby a length of time, for the difference between the information potential and the reference potential to reach a sense limit, can be decreased. As a result, a longer data retention time is obtained.

BRIEF DESCRIPTION OF THE DRAWINGS

Preferred embodiments of the present invention are described by reference to the accompanying drawings in which:

FIG. 7 shows, by control contents, the operation states of control transistors of a semiconductor memory of the second embodiment of the present invention;

FIG. 10(a) is a diagram showing variations in signal voltage at a sense amplifier input terminal in the absence of a calibration technique of the third embodiment of the present invention and FIG. 10(b) is a diagram showing variations in signal voltage at a sense amplifier input terminal in the presence of the calibration technique;

DETAILED DESCRIPTION OF THE PRESENT INVENTION

Preferred embodiments of the present invention will be described by making reference to the accompanying drawing figures.

Referring first to FIG. 1, a first embodiment of this invention is described.

Figure 1A:
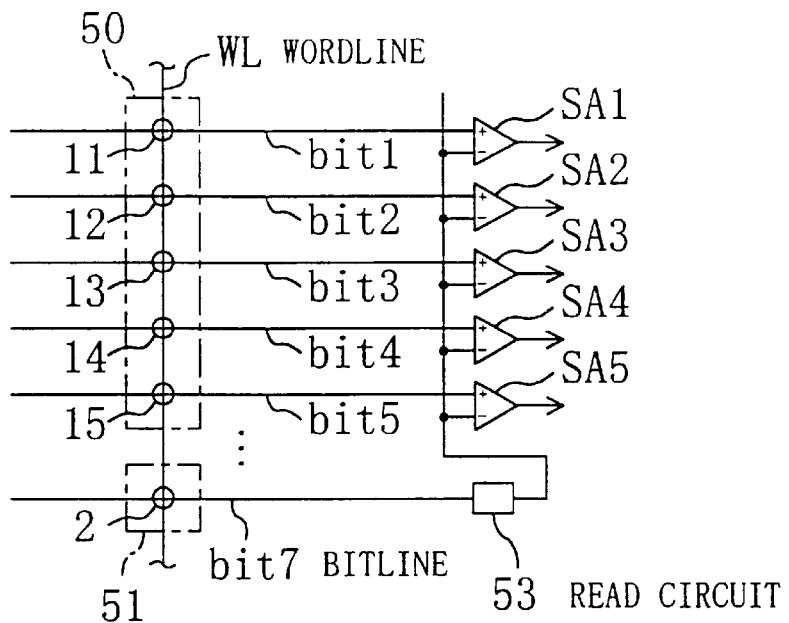
FIG. 1(a) shows a first embodiment of the present invention and FIG. 1(b) illustrates a memory cell shown in FIG. 1(a)
Figure 1B:
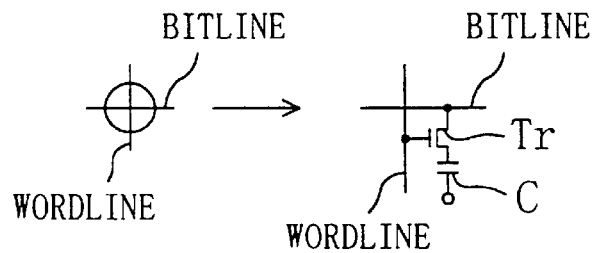

In FIG. 1(a), 11–15 are memory cells (information memory cells) for storing information. These memory cells 11–15 belong in a first memory cell group 50. 2 is a memory cell that belongs in a second memory cell group 51. WL is a word line to which the memory cells 11–15 of the first memory cell group 50 and the memory cell 2 of the second memory cell group 51 are coupled. Each of the memory cells 11–15 and 2, shown in symbolic form in FIG. 1(a), is made up of a cell transistor Tr and a cell capacitor C as shown in detail in FIG. 1(b). In FIG. 1(b), only one word line WL is shown; however, there exist a plurality of word lines WL and memory cells 11–15 and 2 are coupled to a word line WL.

The memory cells 11–15 of the first memory cell group 50 are coupled, through bit lines bit1 to bit5, to differential input terminals of corresponding sense amplifiers SA1–SA5. On the other hand, the memory cell 2 of the second memory cell group 51 is coupled, through bit line bit7, to a read circuit 53. The memory cell 2 of the second memory cell group 51 stores information equivalent to a reference potential, e.g., information representing an electric charge equivalent to an approximately intermediate value of an electric charge equivalent to the information of 1 and an electric charge equivalent to the information of 0. The read circuit 53 reads the information stored in the memory cell 2 for forwarding to the other differential input terminals of the sense amplifiers SA1–SA5.

Each sense amplifier makes a comparison between information received from its corresponding memory cell of the first memory cell group 50 and information received from the cell 2 of the second memory cell group 51 and reads the information stored in the corresponding memory cell.

Modification of the First Embodiment

Figure 2:
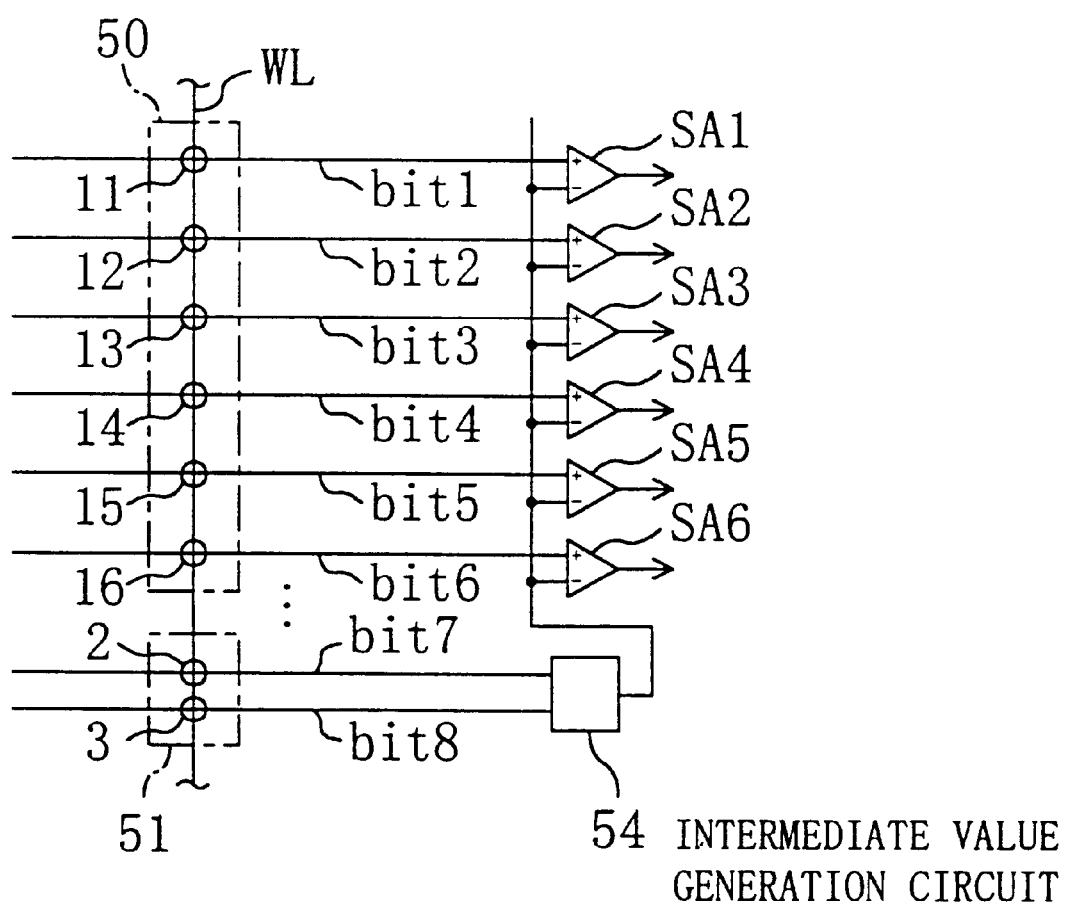
FIG. 2 shows a modified form of the first embodiment of the present invention.

FIG. 2 shows a modified form of the first embodiment of the present invention.

In this modification, the second memory cell group 51 is composed of two memory cells 2 and 3. Whereas the memory cell 2 stores an electric charge equivalent to the information of 0, the memory cell 3 stores an electric charge equivalent to the information of 1. These two pieces of information stored in the memory cells 2 and 3 are fed, through bit lines bit7 and bit8, to an intermediate value generation (reference potential generation) circuit 54 which generates, based on the information received, a reference potential, i.e., an intermediate potential. This reference potential is fed to each of the sense amplifiers SA1–SA5. The sense amplifiers SA1–SA5 determine whether data, stored in their corresponding memory cells, are 1 or 0.

In each of the first embodiment and the present modification, each memory cell can assume either the state of 1 or the state of 0; however, so-called multi-bit memory cells may be employed.

Figure 3:
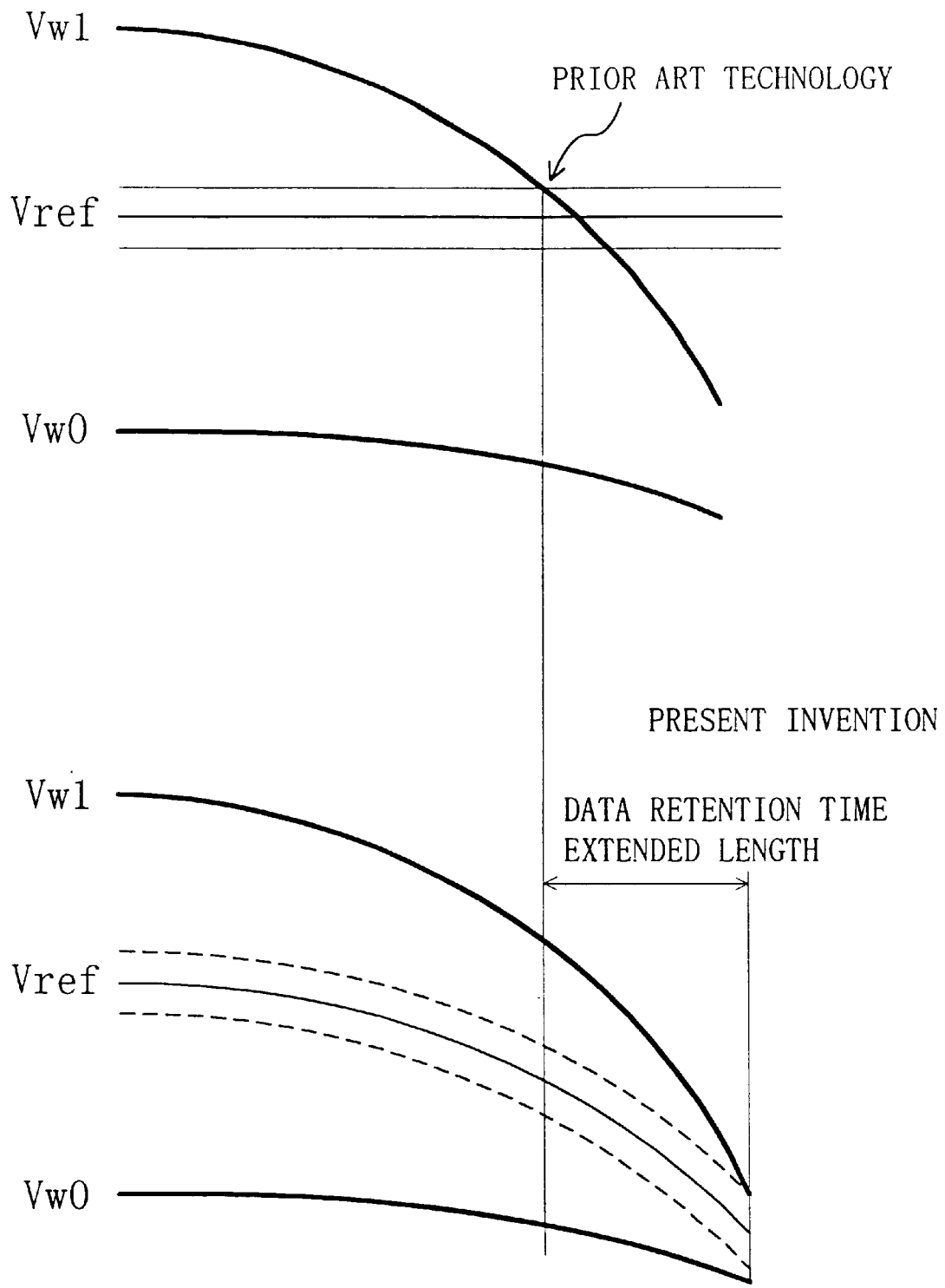
FIG. 3 is a graphical diagram useful in understanding the effect of improvements in the data retention time in the first embodiment of the present invention.

Referring now to FIG. 3, the reason of why the above-described structures of the first embodiment and its modification make it possible to achieve an increase in the data retention time, is explained. FIG. 3 shows both time variations in the potential of memory cell storage nodes in a conventional structure wherein the potential of storage nodes which store information of 1 is Vw1 and the potential of storage nodes which store information of 0 is Vw0, and time variations in the potential of memory cell (reference memory cell of the first and second memory cell groups) storage nodes in the present invention. As can be seen from FIG. 3, Vref, stored in the reference memory cell 2 serving as a reference level, also falls to variation in the potential of the information storage node Vw1, thereby achieving an increase in the data retention time.

The reference memory cell 2 is disposed for every word line WL. As a result of such arrangement, even when the word lines vary in the length of time from the time data is written to the time the data is read out, times from writing data and to reading out the data completely agree with one another between the information memory cells 11–15 and the reference memory cell(s) 2 (2, 3), which guarantees accurate operations.

Second Embodiment

Figure 4:
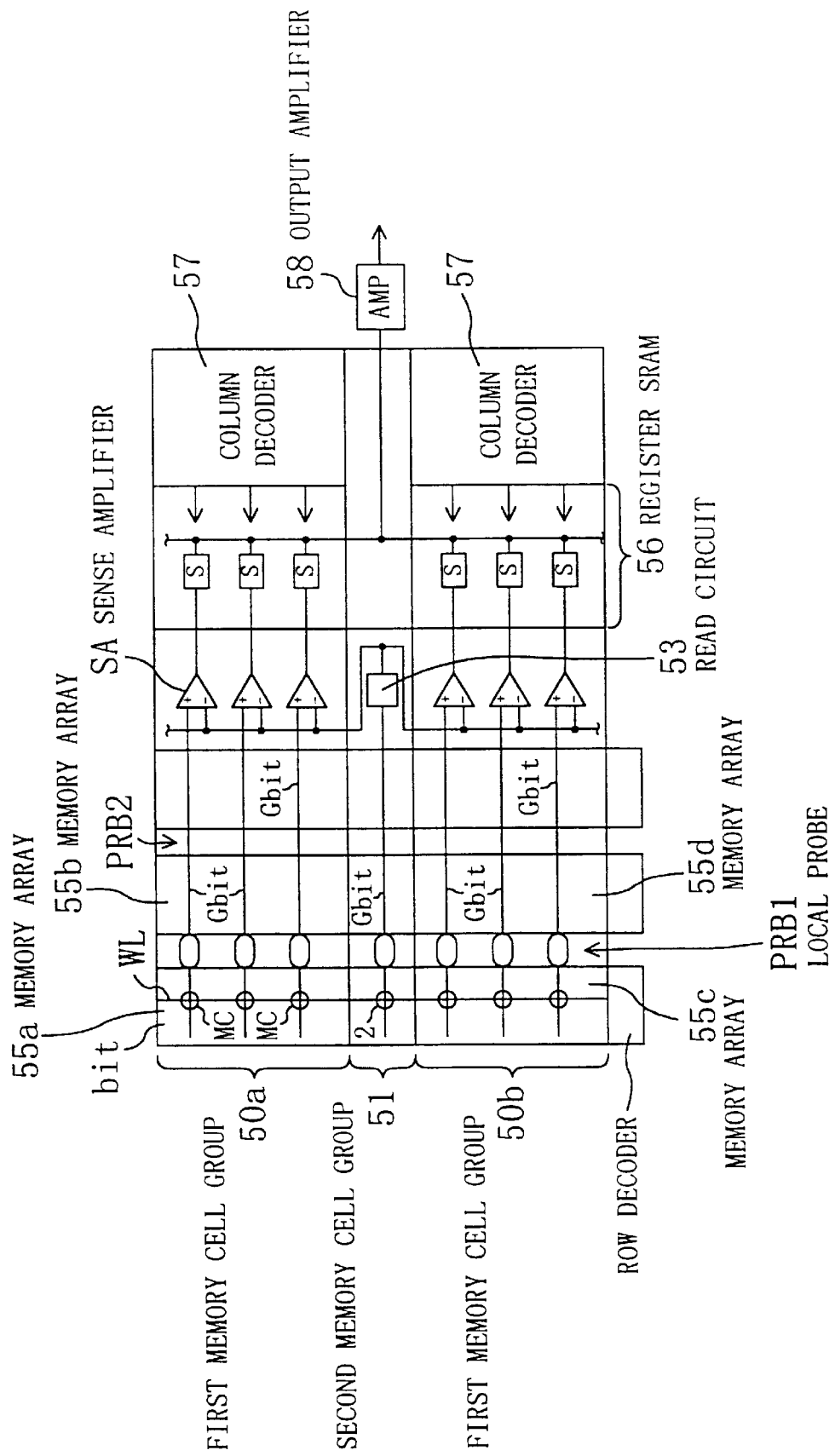
FIG. 4 shows a second embodiment of the present invention.
Figure 5:
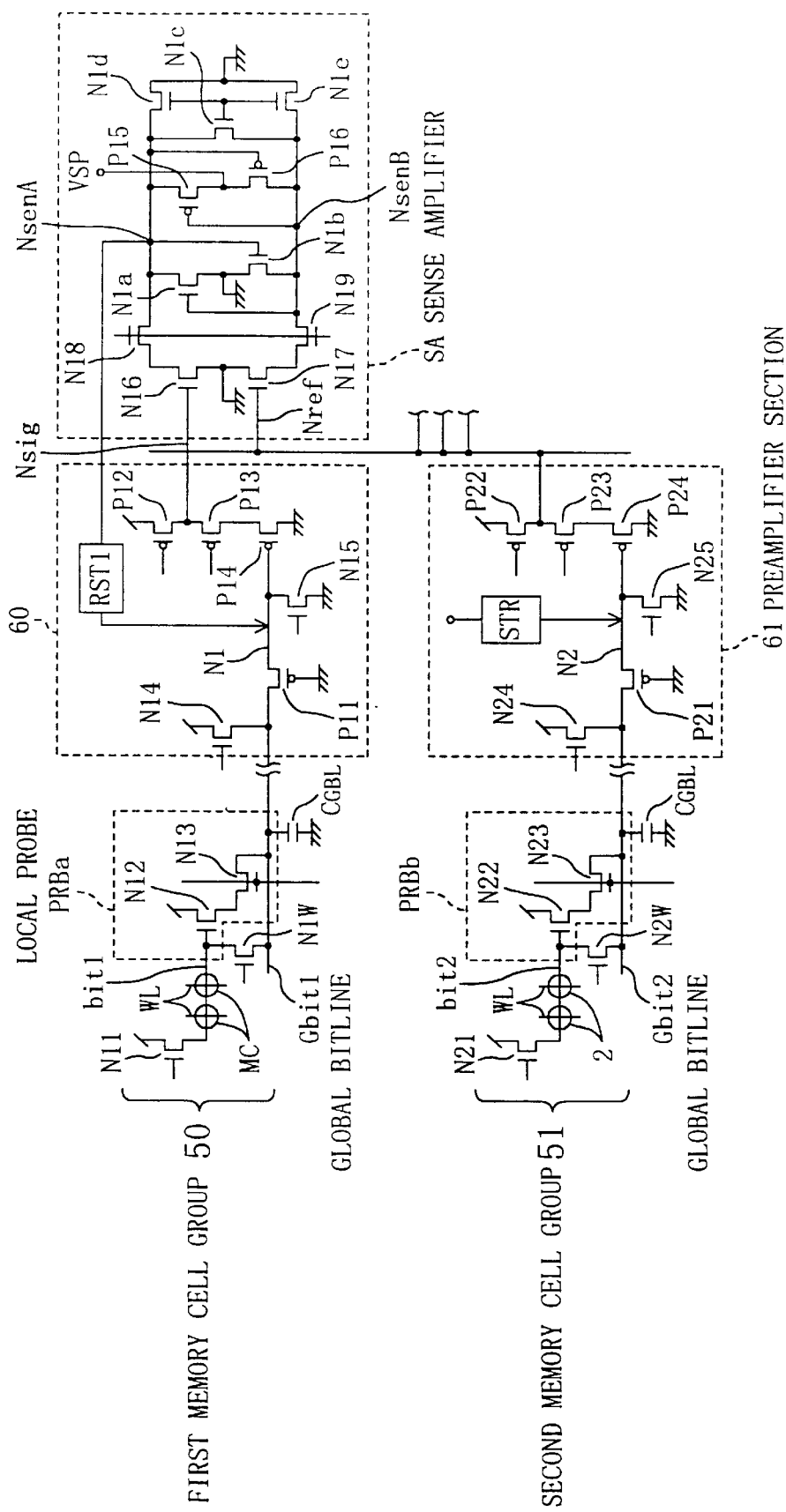
FIG. 5 shows in detail major parts of the second embodiment of the present invention.

Referring now to FIGS. 4 and 5, a second embodiment of the present invention is described below.

FIG. 4 shows the second embodiment. FIG. 5 illustrates in detail elements of the second embodiment.

In the second embodiment, the first memory cell group 50 is (vertically in the figure) divided into two sections and the second memory cell group 51 is disposed between these two sections. This arrangement aims to carry out reference potential information transmission from the second memory cell group 51 which stores reference potential information to the first memory cell group 50 in the same time with good symmetry and to allow the first and second memory cell groups 50 and 51 to receive the same amount of noise for noise cancellation.

In the figure, in the second memory cell group 51 the number of reference memory cells coupled to the same word line is one. However, the FIG. 2 structure may be used. This, however, requires the provision of the intermediate value generation circuit 54.

In the figure, 55a–55d are memory arrays. Each memory array has word lines WL, bit lines bit, memory cells MC that belong in the first memory cell group 50, and a memory cell 2 that belongs in the second memory cell group 51. A plurality of local probes (local probe means PRB1 and PRB2) are disposed correspondingly to the memory arrays. The number of local probes is equal to the number of bit lines of a corresponding memory array and each local probe is coupled to its corresponding bit line bit and acts as a signal detection circuit operable to detect data on the bit line bit. The outputs of the local probes PRB1 and PRB2 are applied, by way of corresponding global bit lines Gbit, to ones of differential input terminals of sense amplifiers (sense amplification means) SA. Each global bit line Gbit is shared between PRB1 and PRB2 located in the same column (not shown in the figure). This makes it possible to reduce the capacitance of a wire coupled to a sense amplifier SA by an amount saved by such sharing.

Data, stored in the memory cell 2 for holding a reference signal level, is transmitted, through a local probe PRB, to the read circuit 53. The output of the read circuit 53 is transmitted to the other differential input terminals of the sense amplifiers SA. The output of each of the sense amplifiers SA is stored in a corresponding SRAM register (a register means) 56, and any one of the outputs of the sense amplifiers stored in the SRAM registers 56 is chosen and taken out for amplification in an output amplifier 58. Such an amplified output is output either to another circuit block or to outside the chip. The SRAM register 56 is not an essential for read operations; however, it serves as a temporal save region at the time of rewriting data, which was read out of a memory cell, into that memory cell after an elapse of a certain length of time.

Referring to FIG. 5, the FIG. 4 circuit is now described in detail.

FIG. 5 shows the first memory cell group 50 at the upper side of the figure and the second memory cell group 51 at the lower side of the figure.

Disposed on the side of the first memory cell 50 are a plurality of memory cells (called information cells) MC for storing information. 64 information cells MC, arranged in the row direction, are coupled to a single word line WL. A plurality of information cells MC (two information cells are shown in the figure), located in the same column, are coupled to a bit line bit1 (the first bit line). This bit line bit1 is coupled, by way of a local probe PRBa (the first probe means), to a global bit line Gbit1 (the first global bit line). This global bit line Gbit1 is coupled, by way of a preamplification section 60, to a differential input terminal of a sense amplifiers SA of the latch type.

Likewise, disposed on the side of the second memory cell group 51 are a plurality of memory cells (called reference cells) 2 for storing reference information. Each of the reference cells 2 is coupled to a corresponding word line WL. A plurality of reference cells (two reference cells are shown in the figure), located in the same column, are coupled to a bit line bit2 (the second bit line). This bit line bit2 is coupled, by way of a local probe PRBb (the second probe means), to a global bit line Gbit2 (the second global bit line). This global bit line Gbit2 is coupled, by way of a preamplification section 61, to differential input terminals of the sense amplifiers SA. Each sense amplifier SA receives at the gate of an input transistor N17 built therein an output from the global bit line Gbit2 through the preamplification section 61. Even when the global bit line Gbit2 has a great wire capacitance, this will have no ill effects on the operation of the sense amplifier SA.

Figure 6:
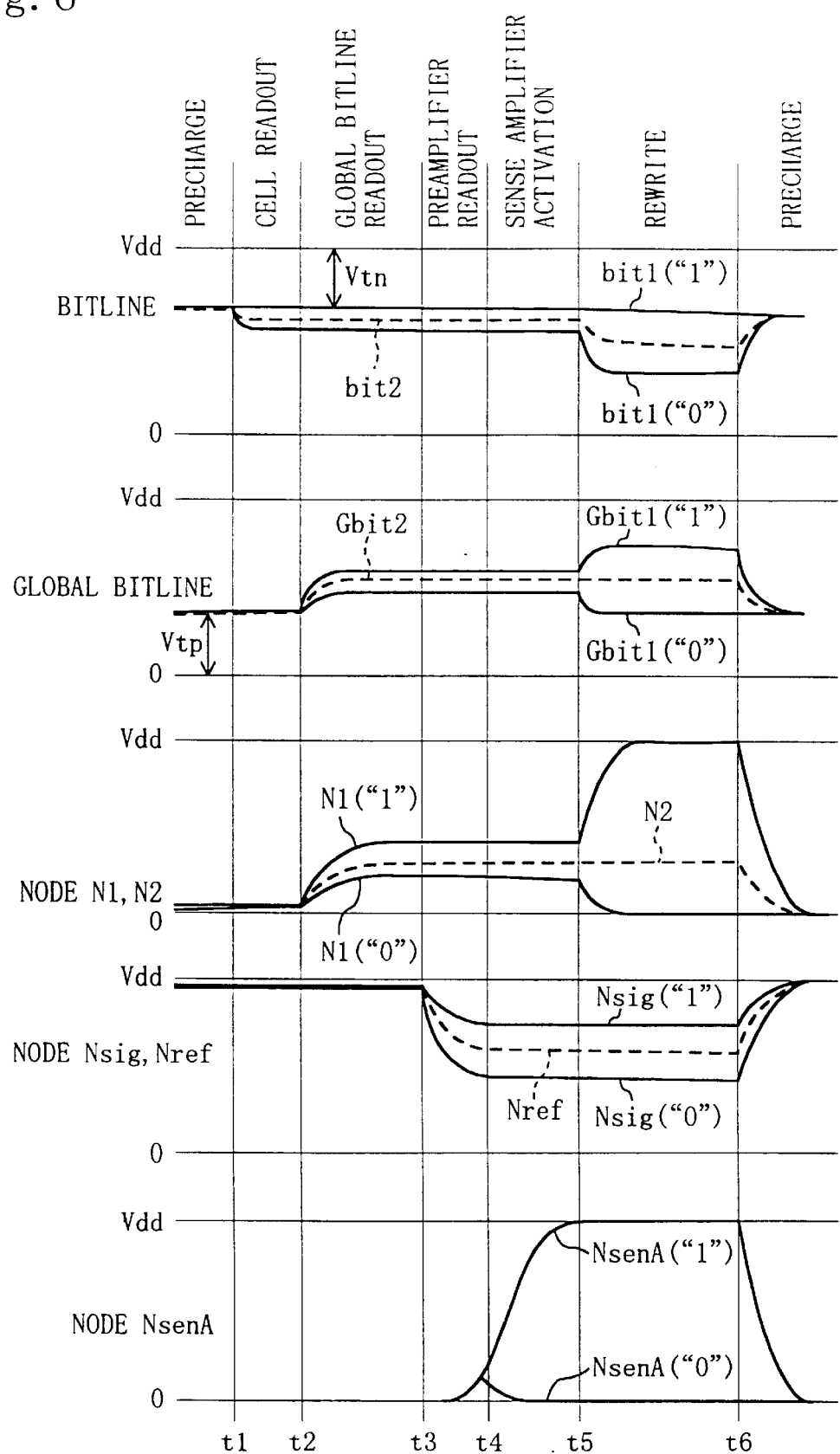
FIG. 6 is a diagram useful in understanding the operation of the second embodiment of the present invention.

The structure is discussed in detail together with its operation. FIG. 6 shows the operation waveforms. FIG. 7 shows the states of main control transistors by control contents (modes). Each mode is explained below.

Precharge Period

BIT LINE bit1 and BIT LINE bit2 are precharged by NMOS transistors N11 and N21 from Vdd down to Vdd−Vtn where Vdd is the supply voltage and Vtn is the threshold voltage. On the other hand, GLOBAL BIT LINES Gbit1 and Gbit2 are precharged up to Vss+Vtp where Vss is the ground voltage and Vtp is the threshold voltage. Such a precharge level may be a different value, e.g., Vss, which will produce no essential difference. Likewise, both nodes N1 and N2 of the preamplification sections 60 and 61 are set at Vss. Both differential input terminals Nsig and Nref of the sense amplifiers SA are set at Vdd. A pair of nodes NsenA and NsenB of the sense amplifiers SA are set at Vss.

Cell Readout Period

A word line WL is activated. Information, stored in an information cell MC of the first memory cell group 50, is read out onto BIT LINE bit1. Reference potential information, stored in a reference cell 2 of the second memory cell group 51, is read out onto BIT LINE bit2. The potential of BIT LINE bit1 varies depending on whether the stored information is 1 or 0 (see FIG. 6). At the same time, the potential of BIT LINE bit2 makes a change equivalent to the reference potential.

Readout onto Global Bit Line

A readout control transistor N13 of the local probe PRBa conducts and the potential of GLOBAL BIT LINE Gbit1 varies depending on the potential of BIT LINE bit1. A readout control transistor N23 of the local probe PRBb conducts and the potential of GLOBAL·BIT LINE Gbit2 varies depending on the potential of BIT LINE bit2. As a result, stored information stored in an information cell MC and reference potential information stored in a reference cell 2 are read out onto GLOBAL BIT LINE Gbit1 and onto GLOBAL BIT LINE Gbit2, respectively.

Preamplifier Readout

PMOS transistors P13 and P23 of the preamplification sections 60 and 61 conduct and the reference potential information and the stored information are input to the sense amplifier SA through the nodes Nsig and Nref for preparing data determination. The reason for providing the preamplification sections 60 and 61 is that there are provided a plurality of sense amplifiers on the side of receiving reference potential information resulting in producing a great load at the input side.

Sensing Operation

The sense amplifier SA senses stored information and the stored information thus sensed is held in an internal latch.

Data Rewriting

The stored information is written by a rewrite circuit RST1 into the information cell MC of the first memory cell group 50. At the same time, the reference potential information is written by a reference write circuit STR into the reference cell 2 of the second memory cell group 51.

Third Embodiment

Figure 8A:
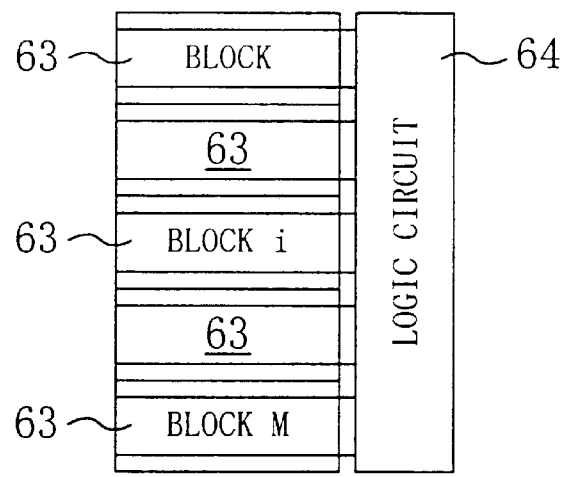
FIG. 8(a) shows a third embodiment of the present invention and FIG. 8(b) shows the internal structure of a block shown in FIG. 8(a)
Figure 8B:
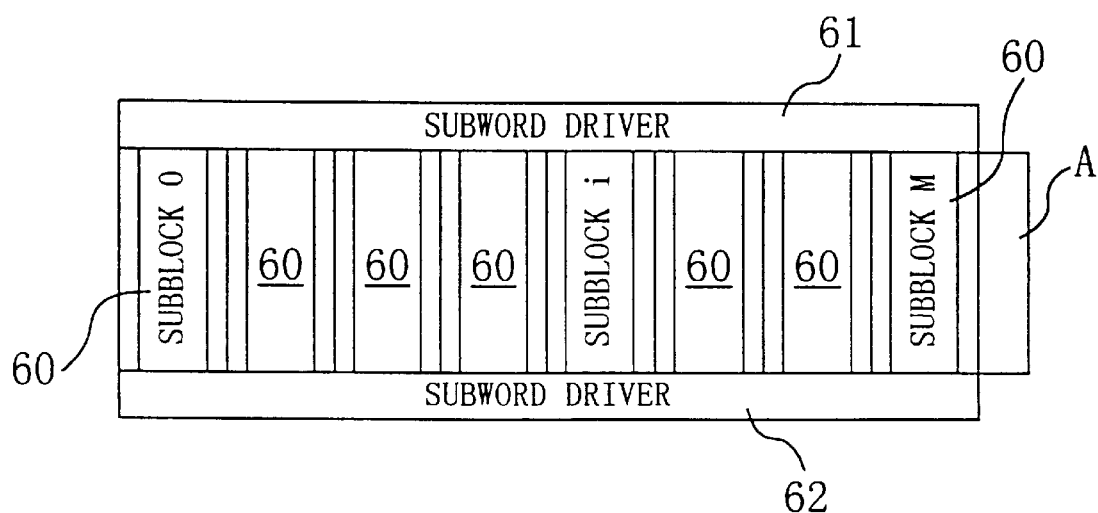
Figure 9:
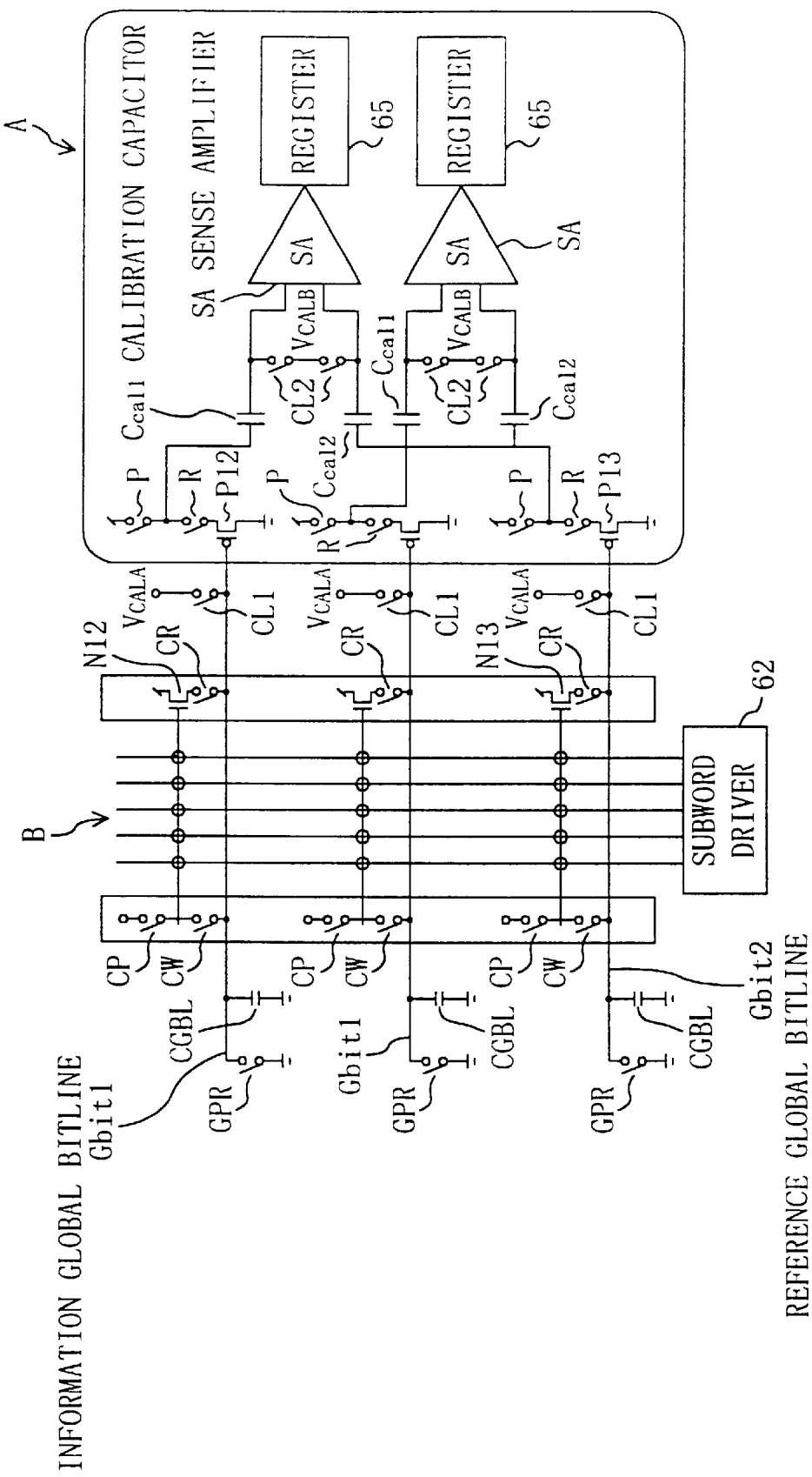
FIG. 9 shows in detail major parts of the third embodiment of the present invention.

Referring now to FIGS. 8 and 9, a third embodiment of the present invention is described. The third embodiment is an improvement of the second embodiment.

The object of the present embodiment is to avoid the phenomenon, which takes place in the second embodiment, that there occurs a reduction in input voltage applied to the sense amplifier SA due to the signal propagation characteristic between the local probes PRBa and PRBb and variations in the signal propagation characteristic between the preamplification sections 60 and 61. The input voltage of the sense amplifier SA varies by a sum of the difference between the threshold voltages (Vtn) of the control transistors N12 and N22 of the two local probes and the difference between the threshold voltages (Vtp) of the control transistors P14 and P24, resulting in a decrease in operation margin. The present embodiment avoids the variation by means of calibration capacitors.

A calibration procedure is described below.

Referring to FIG. 9, both a transistor switch CL1 and a transistor switch (short circuit means) CL2 conduct, whereby both GLOBAL BIT LINE Gbit1 for stored information and GLOBAL BIT LINE Gbit2 for reference potential information are charged to a predetermined voltage VCALA and the input voltage of the sense amplifier SA is charged to a predetermined voltage VCALB. At this time, a bit line write switch CW is in the state of conduction and the voltage VCALA is written to BIT LINE bit1 as well as to BIT LINE bit2.

Next, the write switch CW enters the nonconducting state and a transistor switch GPR enters the conducting state, whereby both GLOBAL BIT LINES Gbit1 and Gbit2 are charged to a low level, that is Vss or Vss+Vt. Thereafter the control transistor N12 of the local probe PRBa and the control transistor N22 of the local probe PRBb are made active. As a result, the potential of GLOBAL BIT LINE Gbit1 increases up to a potential which is lower than the potential of a corresponding bit line (i.e., BIT LINE bit1) by Vt(the threshold voltage). Likewise, the potential of GLOBAL BIT LINE Gbit2 increases up to a potential which is lower than the potential of a corresponding bit line (i.e., BIT LINE bit2) by Vt. At this time there exists a difference in potential between GLOBAL BIT LINES Gbit1 and Gbit2 equivalent to a difference between Vtn(data) and Vtn(ref) where Vtn(data) is the threshold voltage of the NMOS control transistor N12 and Vtn(ref) is the threshold voltage of the NMOS control transistor N22.

Subsequently, both the control transistor P13 of the preamplification section 60 for stored information and the control transistor P23 of the preamplification section 61 for reference information are activated. As a result, the potential of GLOBAL BIT-LINE Gbit1 is transmitted to the left-hand side of a first calibration capacitor (a first capacitor means/calibration means) Ccal1 while on the other hand the potential of GLOBAL BIT LINE Gbit2 is transmitted to the left-hand side of a second calibration capacitor (a second capacitor means/calibration means) Ccal2. Whereas the value of the potential transmitted to Ccal1 is VCALA−Vtn(data)−Vtp(data), the value of the potential transmitted to Ccal2 is VCALA−Vtn(ref)−Vtp(ref) where Vtp(data) is the threshold voltage of the PMOS control transistor P13 and Vtp(ref) is the threshold voltage of the PMOS control transistor P23. Note that each of Vtp(data) and Vtp(ref) is less than zero.

Ideally, the foregoing two values should perfectly agree with each other; however, due to a variation in threshold voltage at the stored information/reference potential information sides, there is produced a difference of −{Vtn(data)−Vtn(ref)}−{Vtp(data)−Vtp(ref)}, leading to a decrease in the overall operation margin. This difference is stored in the calibration capacitors Ccal1 and Ccal2, which allows the foregoing variation to be absorbed and compensated to secure a desired operation margin for the sense amplifier SA.

FIG. 10 shows the effect of the foregoing calibration. FIG. 10(a) shows an example without calibration. FIG. 10(b) shows an example with calibration. As can be seen from the figure, the degree of variation in signal voltage at sense amplifier input terminal is reduced, whereby stable operations can be achieved.

The above-described operation steps form a calibration sequence. Additionally, the transistor switch CL1 and the bit line write switch CW together form a calibration potential setting means.

FIG. 8 shows a structure comprising memories (DRAMs) and logical circuits on a single chip. FIG. 8(b) illustrates a structure formed by arranging a plurality of sub-blocks 60 (eight sub-blocks 60 in the figure) each of which is made up of a preamplifier/sense amplifier section A and a section B of FIG. 9. Arranged respectively above and below these sub-blocks 60 are sub-word drivers 61 and 62 for selecting a word line. The preamplifier/sense amplifier section A is placed on the right-hand side of the rightmost sub-block 60. Referring to FIG. 8(a), m blocks 63, each of which is formed according to the FIG. 8(b) structure, are vertically arranged and a logical circuit 64 is placed on the right-hand side. This arrangement allows register circuits 65 of the preamplifier/sense amplifier sections A of the sub-blocks 60 to simultaneously transmit multi-bit data to the logical circuit 64.

Fourth Embodiment

A fourth embodiment of the present invention is described. The object of the present embodiment is to reduce noise occurring at operation time, to provide an extended operation margin. The present embodiment aims to minimize a noise factor (i.e., array noise).

The array noise is the phenomenon that, when there occurs capacitance coupling of a node extending throughout an entire memory array and read signal lines, a variation in potential of the read signal lines is fed back to the read signal lines themselves. Due to such array noise, data, called the minority bit, is read out with error.

Figure 11A:
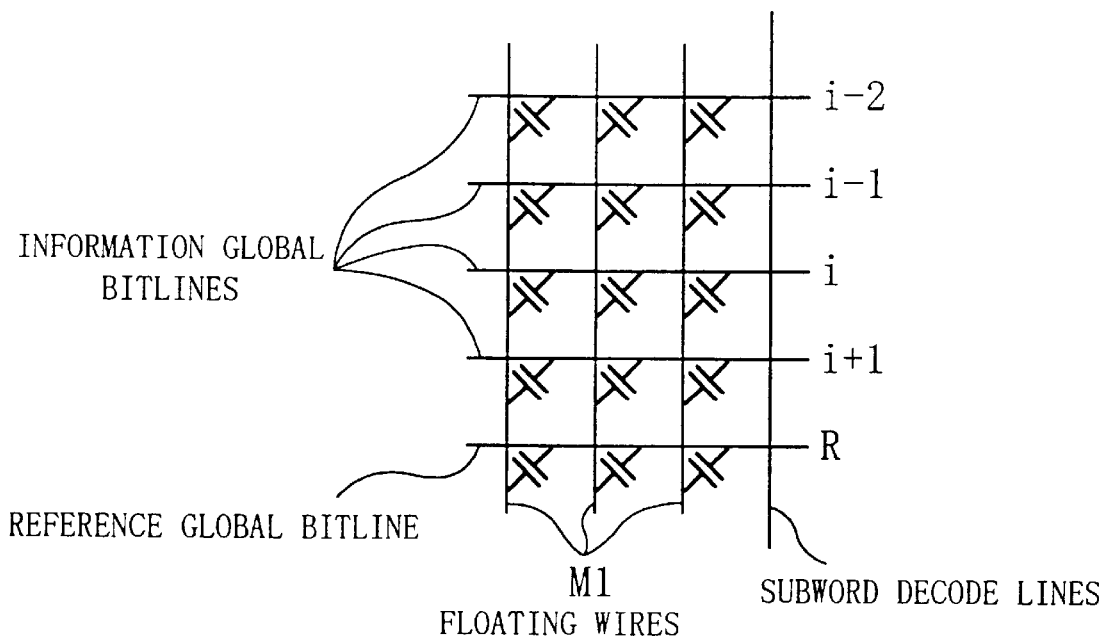
FIG. 11(a) shows a fourth embodiment of the present invention and FIG. 11(b) is a diagram useful in understanding the effect of floating wiring of the fourth embodiment of the present invention.

Suppose here that, for example, data of 1 is read out onto an information global bit line i while on the other hand data of 0 is read out onto the remaining global bit lines 1, 2, i−1, i+1, and so on (see FIG. 11(a)). In this case, an entire memory array is drawn in the direction of reading data of 0 by inter-bitline and interplate capacitive coupling. As a result, the data 1 that is read out from the global bit line i is substantially degraded, therefore causing readout errors.

In accordance with the present embodiment, such an error occurring in read operations is eliminated by means of a structure in which floating wires M1 (a group of intersection wires), which serve as capacitor means, are arranged astride both the stored information and reference potential information global bit lines (1 . . . i . . . , R). The floating wire M1, as the name implies, is a wire that effectively and electrically floats. Also, a wire, which is coupled to a fixed potential via a resistor with a high resistance, can be regarded as a wire which is effectively floating.

The present embodiment is characterized in that the floating wires M1 are arranged astride both the stored information and reference potential information global bit lines (1 . . . i . . . , R). These global bit lines (1 . . . i . . . , R) within the memory array are coupled together by the floating wires M1 and a variation in potential of the global bit line is a quantity intermediate to quantities of the direction in which data are read out from the global bit line. This average value is coupled again to the global bit line R (the reference potential information global bit line) through capacitive coupling. If the number of cells from which data of 1 is read out is great, then the potential of the floating wire M1 moves in the direction in which data 1 is read out. Correspondingly to such movement, the potential of the global bit line R (the reference potential information global bit line) varies in the same direction that the potential of the floating wire M1 does. This makes it possible to earn a signal margin with a minority data read line.

For example, if there is no capacitive coupling with the global bit line R, then only 0 data read lines operate independently of the global bit line R. This results in producing a 0 data readout error. The strength of such in-memory array mutual coupling can be changed by changing the number of floating wires M1, to control the level of signals to enter an optimal state.

Figure 11B:
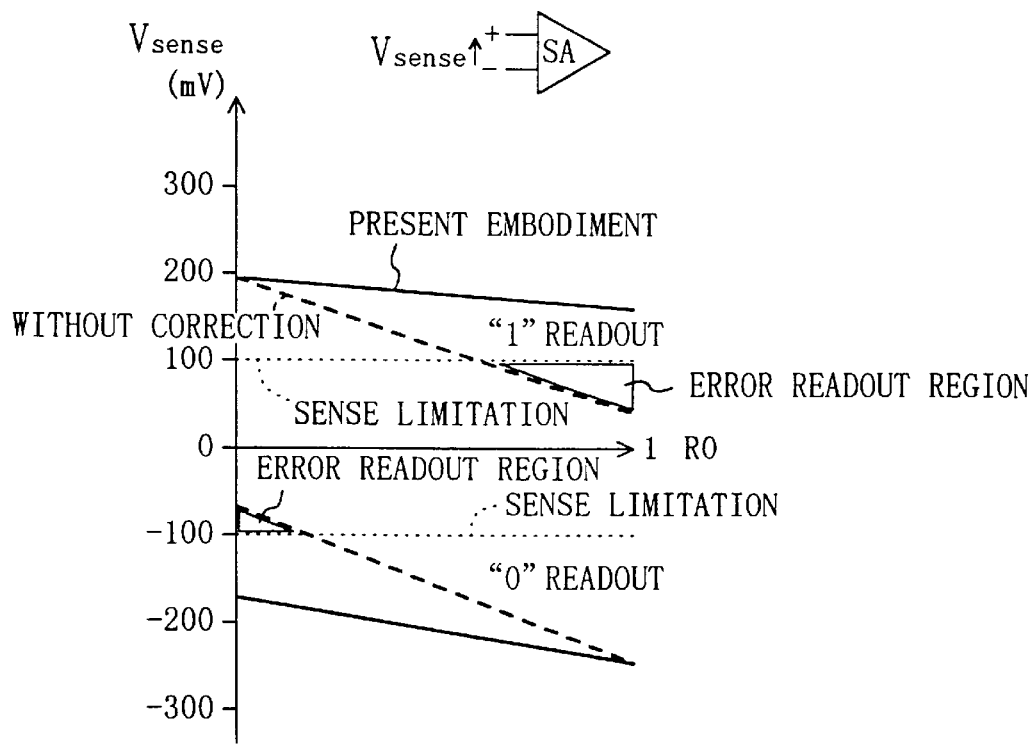

Referring to FIG. 11(b), the effect of reducing noise in the present embodiment is shown. In FIG. 11(b), the abscissa indicates the calibration data isolation ratio (RO) defined as a parameter. If RO=1, this shows that all data on the same word line are 0 data. On the other hand, if RO=0, this shows that all data on the same word line are 1 data. The ordinate indicates the sense amplifier input terminal signal potential. At the time of reading 1 data, it is effective that a signal is output exceeding a sense limit. In accordance with the present embodiment, it is possible to perform accurate read operations all over the region of the calibration data isolation ratio RO, as shown in FIG. 11(b).

Figure 12:
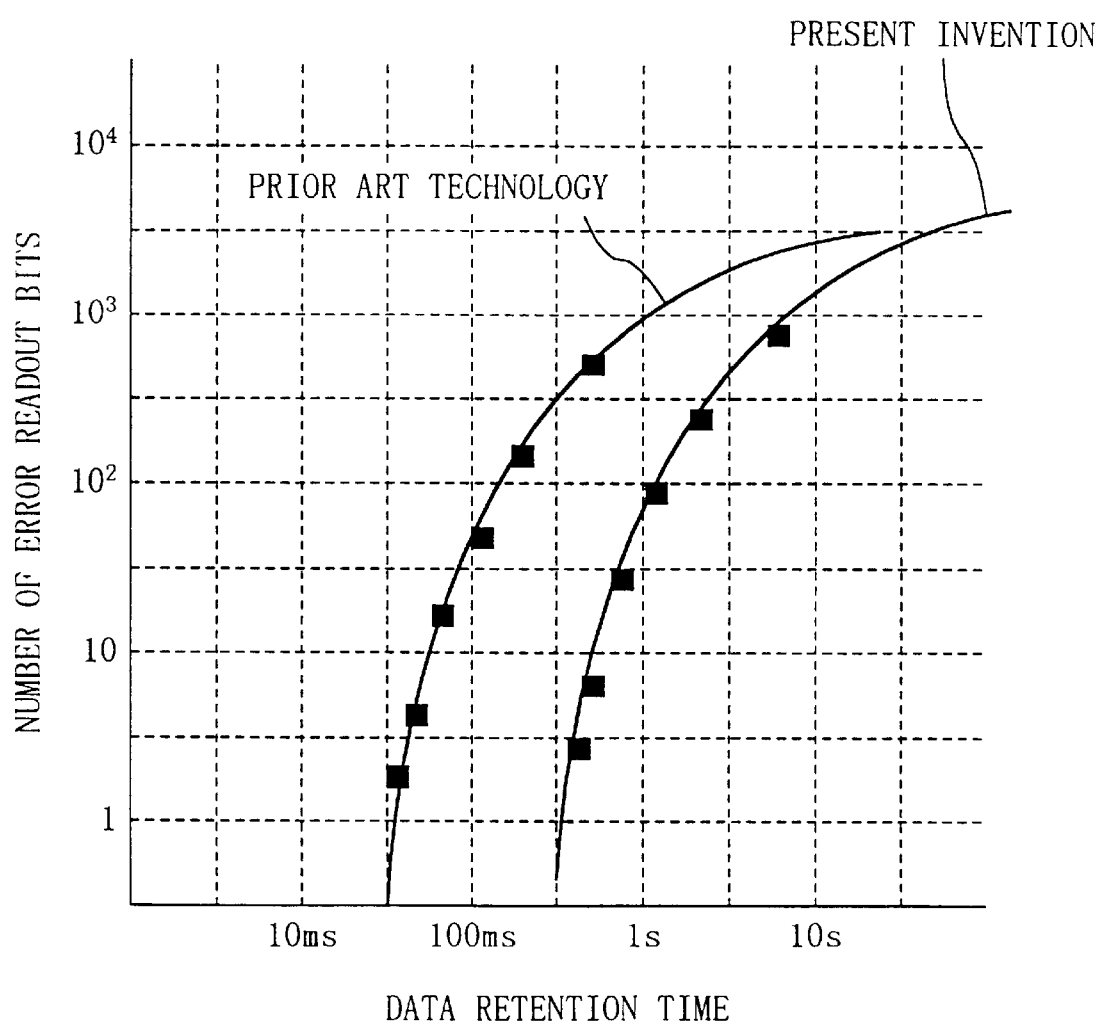
FIG. 12 is a graphical diagram useful in understanding the effects of improving the data retention time in a semiconductor memory of the fourth embodiment of the present invention.

FIG. 12 shows the data retention characteristic of DRAMs. As can be seen from FIG. 12, the present embodiment has the ability to improve the data retention characteristic for about one figure.

Fifth Embodiment

A fifth embodiment of the present invention is now described. The present embodiment is directed to redundancy system configurations for use in DRAMs of the present invention.

A redundancy system, generally used in DRAM, is a circuit for replacing a memory cell which is not functioning correctly with an electrically normal one. Generally, a redundancy circuit is composed of two different circuits, namely a redundant address detection circuit for storing faulty memory cell addresses and information (redundant information) for determining which one of spare memory cells should provide a backup when a certain memory cell is rendered unusable, and a redundant address circuit for carrying out, based on the information, address switching.

Figure 13A:
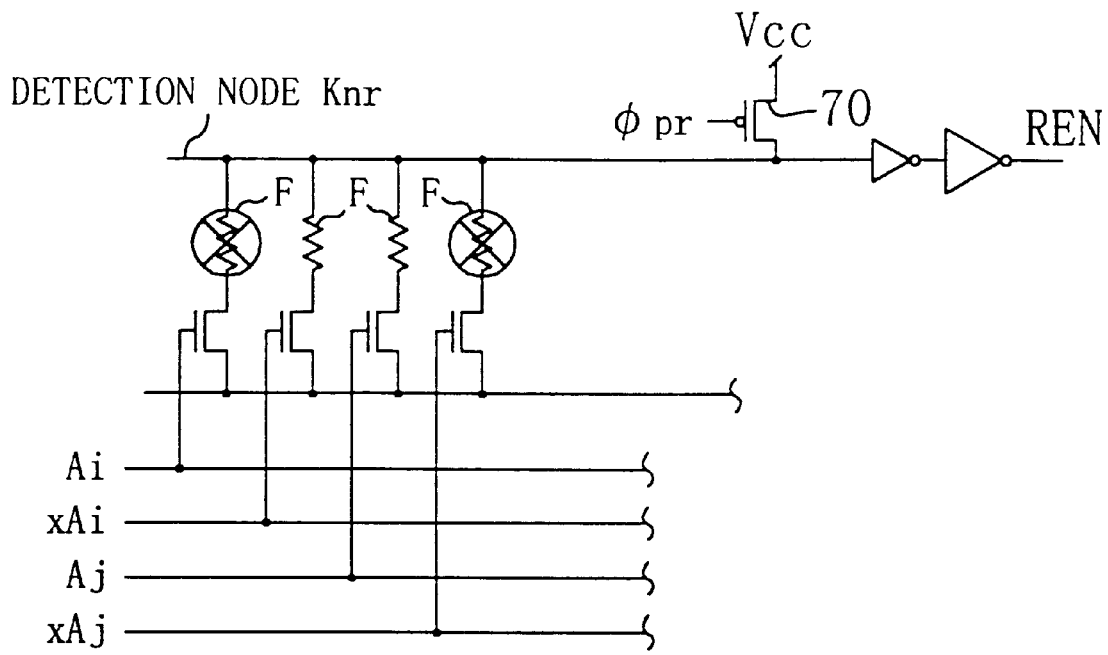
FIG. 13(a) shows the organization of a conventional redundant address detection circuit and FIG. 13(b) shows the organization of a conventional redundant address circuit.
Figure 13B:
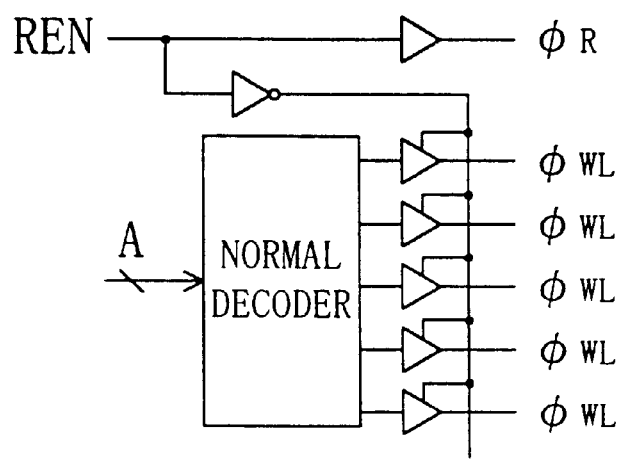

FIG. 13(a) depicts a prior art redundant address detection circuit. FIG. 13(b) depicts a prior art redundant address circuit. As a medium for storing redundant information, a fuse F, formed of, for example, a polysilicon wiring layer, is employed. The fuse F is cut by laser trimmer equipment to store redundant information. The cutting of the fuse F is detected by the presence or absence of an electric current path and the result is fed to the redundant address circuit which then performs actual address switching.

Referring still to FIG. 13(a), a precharge transistor 70 is used to precharge each of sense nodes Knr to Vcc (the supply voltage). When address signal lines Ai, xAi, Aj, and xAj vary, only sense nodes Knr relative to addresses with fuses F cut by laser are not discharged. With reference to FIG. 13(a), only when Ai=1 and Aj=0, such sense nodes Knr are not discharged. At the time of this address, a redundancy activation signal REN becomes active. Because of this signal REN, a redundancy word line φR is made active while at the same time a normal word line φWL is made inactive.

Figure 14A:
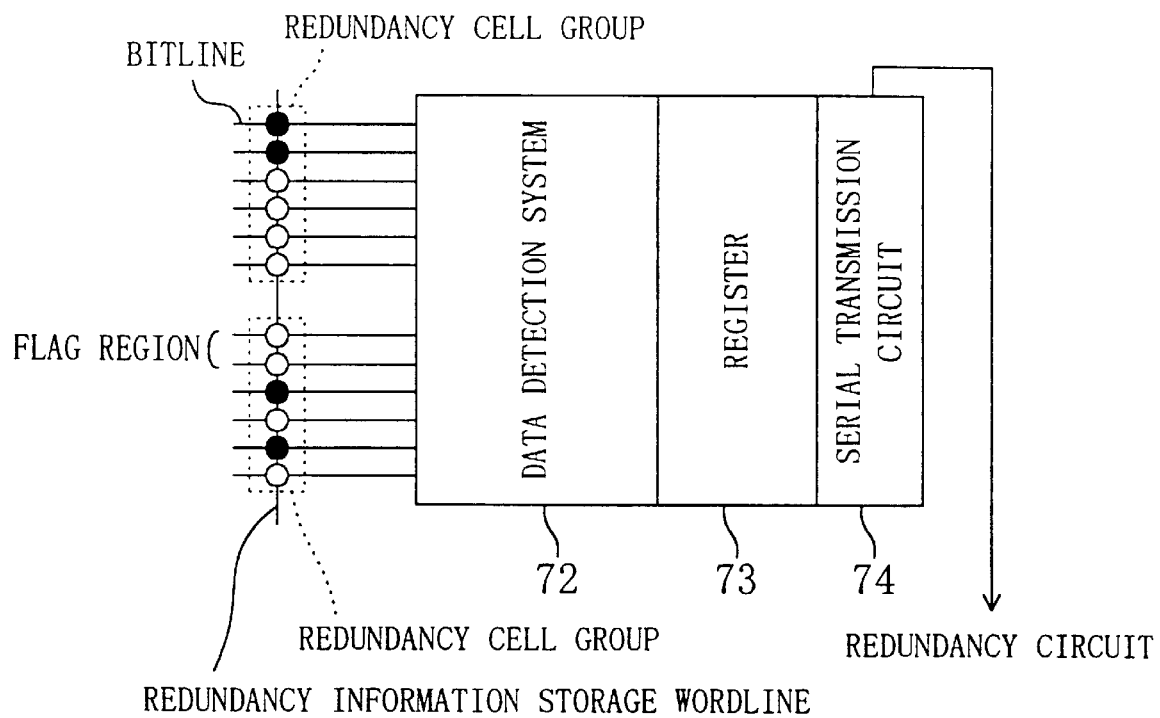
FIG. 14(a) shows a fifth embodiment of the present invention and FIG. 14(b) shows the detailed structures of portions that are symbolized in FIG. 14(a)
Figure 14B:
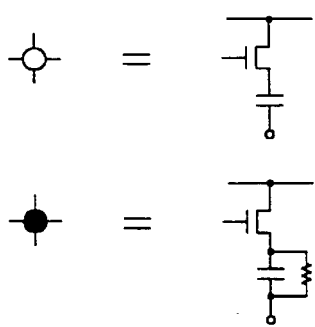

A redundancy system of the present embodiment is described by making reference to FIG. 14.

The present embodiment uses a redundancy system. This redundancy system is capable of storing redundant information by destruction/nondestruction of DRAM memory cell capacitor films. Here, general capacitor films are formed of a high dielectric film such as silicon oxide, silicon nitride, silicon oxide/silicon nitride sandwich structure, and tantalum oxide. Redundancy information is stored by film destruction/nondestruction.

At the same time a probe test is carried out, a write operation of writing redundant information into a memory cell capacitor film is performed according to the following procedure.

In the first place, all memory cells including redundant information memory cells are subjected to examination and measurement. When there is found a faulty redundant information memory cell, a series of redundancy memory cells including that faulty memory cell is not used and another series of redundancy memory cells is used. Additionally, invalid flag data indicative of such a state is written, together with other redundant information, to a flag region of the redundancy memory cell to be invalidated. Such information writing is carried out by establishing a potential equivalent to 0 in a bit line coupled to the redundancy memory cell to be destroyed and by setting the plate voltage higher than the external power supply voltage. For redundancy memory cells that are not destroyed, the plate voltage is set either at the power supply voltage or at the floating level. In FIG. 14(a), 72 is a data detection system with a similar structure to the FIG. 9 structure but does not contain therein the register 65. In FIG. 14(a), whereas memory cells with a destroyed capacitor film are symbolized by a black dot, memory cells with a capacitor film that is not destroyed are symbolized by white dot.

A way of reading out information written into a redundancy memory cell by capacitor film destructive write is described.

In the first place, data 0 is written into all the memory cells containing redundant information. At this time, the plate voltage is set at the power supply voltage. After an lapse of from about 0.01 ms to about 10 ms, in a redundancy memory cell whose capacitor film has been destroyed the stored data is drawn to the plate voltage to make an inversion from data 0 to data 1. On the other hand, in a redundancy memory cell whose capacitor film has not been destroyed the stored data (i.e., the 0 data) is held. The data are read out as redundant information to be stored in a register 73 and thereafter are serially transmitted at high speed to a redundancy circuit (described later) by a serial transmission circuit (transmission means) 74.

The foregoing lapsed time (i.e., 0.01 ms to 10 ms) is characterized in that it is longer than a period of time necessary for discharging approximately all of electric charges in destroyed capacitor films, is sufficiently longer than a normal data readout time, and is sufficiently shorter than a normal data retention time. When a flag is detected indicating that a certain group of redundancy memory cells is invalid, the transmission of information stored in the group is skipped. Based on the above, redundant address detection and control is carried out. Redundant data transmission operation is automatically performed only when power is turned on and thereafter only the redundancy circuit performs the operation. The same effects may be achieved, also in cases where a 1 is written to memory cells and the plate is set at zero.

Figure 15:
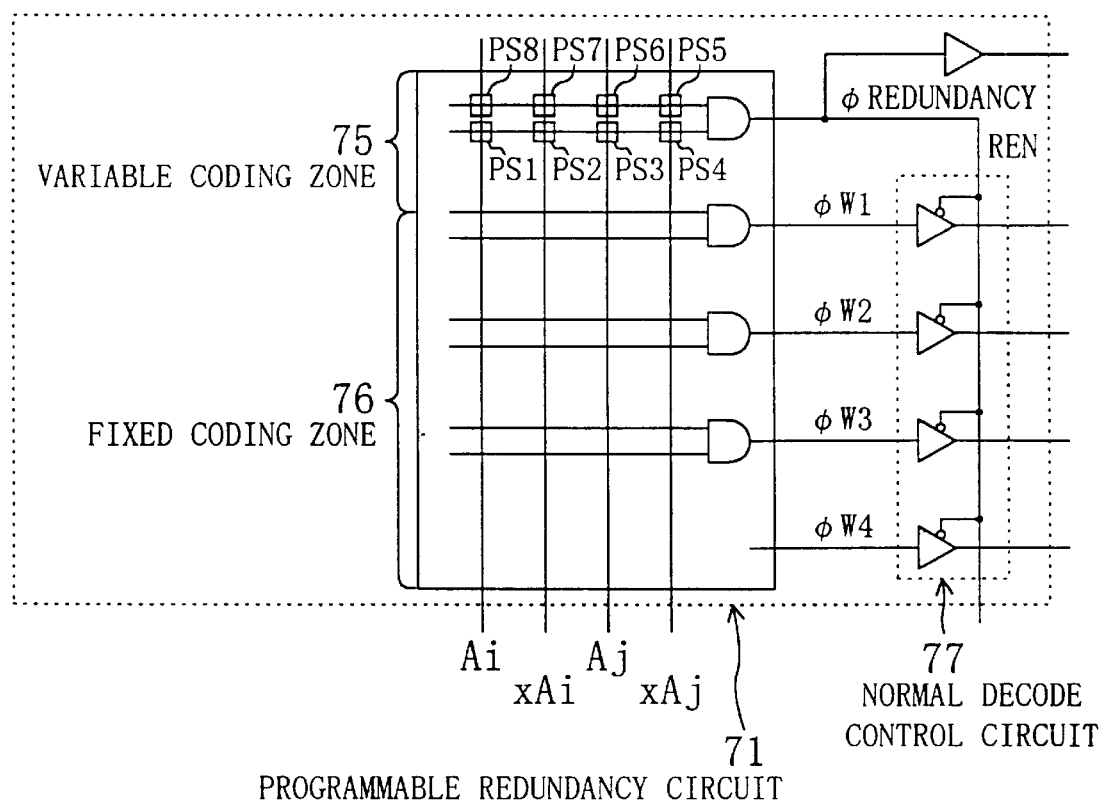
FIG. 15 shows a redundancy circuit of the fifth embodiment of the present invention.

Referring now to FIG. 15, a programmable redundancy circuit 71 is shown. This redundancy circuit (decode means) 71 has two coding zones, namely a variable coding zone 75 and a fixed coding zone 76. When power is turned on, serial transmission of redundant information from the serial transmission circuit 74 of FIG. 14 to the variable coding zone 75 is carried out.

The variable coding zone 75 is provided with eight programmable switch elements PS1, PS2, PS3, PS4, PS5, PS6, PS7, and PS8. Redundant information is serially transmitted from the serial transmission circuit 74 to the programmable switch elements PS1–PS8 in the PS1, PS2, PS3, PS4, PS5, PS6, PS7, PS8 order, and it is structured such that at the time of a faulty address to the redundant information the redundancy activation signal REN is generated from the variable coding zone 75. In the figure, in response to redundant information the two programable switch elements PS4 and PS8 conduct, and the remaining programmable switch elements nonconduct, and when Ai (address signal)=1 and xAj (address signal)=1, the redundancy activation signal REN is generated. The signal REN is output to the normal decode control circuit 77 for controlling the transmission of normal decode signal φw1 to φw4 from the fixed coding zone 76.

In accordance with the present embodiment, the programmable redundancy circuit 71 is divided into the variable coding zone 75 and the fixed coding zone 76. However, the circuit 71 may be formed of only a variable coding zone. In such a case there is no need for the provision of the normal decode control circuit 77, therefore speeding up the operation but resulting in an increase in coding area.

In the case of employing the above-described circuit configuration, redundancy detection is made only in a normal static circuit, which therefore makes it possible to realize a fast low-power redundancy system. If transmission of redundant information to the variable coding zone 75 is carried out suitably to a part of an external address, this achieves a considerable reduction in circuit size of the redundancy circuit 74. As a result, there is achieved a reduction of the chip area.

If it is arranged such that redundant information is compressed when stored in a redundancy cell group of FIG. 13 and is expanded when read out from the redundancy cell group, this makes it possible to reduce the number of redundancy memory cells forming a redundancy memory cell group therefore preventing an increase in chip area. This redundant information compression technology is an effective technique utilizable in conventional fuse redundancy technologies because of the ability of reducing the number of fuses.

In the present embodiment, the present invention is used for storing redundant information in a DRAM redundancy system. However, the present invention may be used for the storage of information other than redundant information. For instance, the present invention may be utilizable in storing manufacturing information including manufacturer information, production date information, lot information, and chip coordinate information. Additionally, it is possible to read out and use previously-stored level calibration information as to an internal analog circuit (e.g., an internal power supply circuit and a power supply level detection circuit) in actual operation. Further, if information for optimal operations of an internal timing generation circuit is stored and loaded to a timing generation circuit at operation start time, this makes it possible to provide semiconductor integrated circuits with a much greater timing margin.

Sixth Embodiment

A sixth embodiment of the present invention is now described. In the fifth embodiment, information storage is made by capacitor film destruction/nondestruction, which makes it possible to form a memory core having a considerably great bit width, e.g., a memory core with a bit width ranging from 256 bits to 2048 bits. This achieves communication of data between such a memory core and a logical circuit by means of a great number of data buses. The sixth embodiment is one application of the fifth embodiment.

Figure 16A:
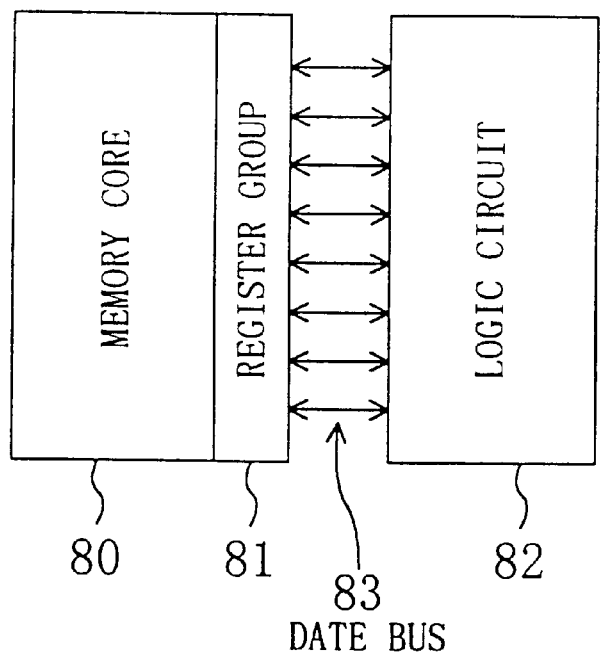
FIGS. 16(a) and 16(b) show a first and a second structure of a semiconductor integrated circuit in accordance with a sixth embodiment of the present invention, respectively.

Referring to FIG. 16(a), arranged at the side of a memory core 80 of the present invention is a group of registers 81. Many data buses 83 are provided establishing communication of data between the register group 83 and a logical circuit 82.

Figure 16B:
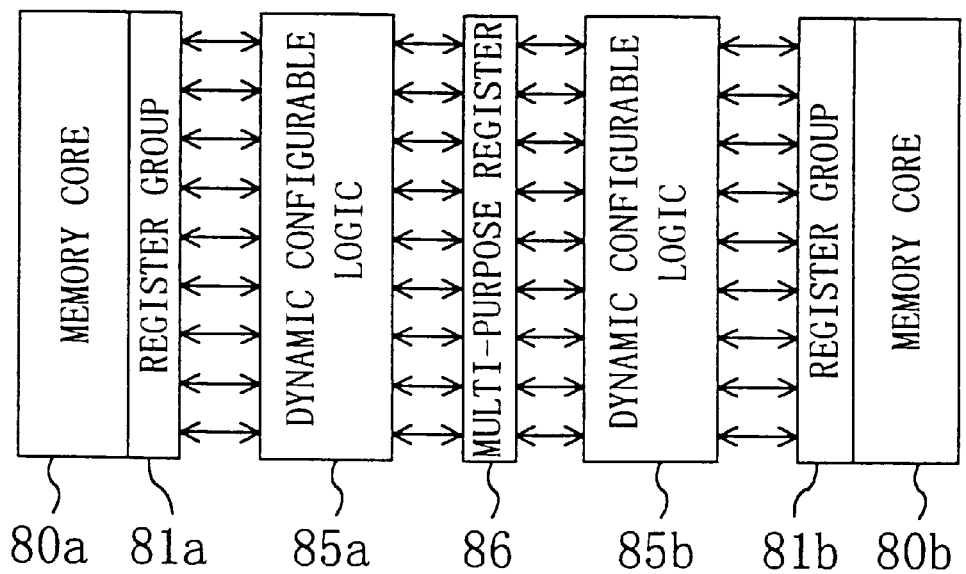

Referring to FIG. 16(b), 82 is a logical circuit (a logical circuit block) formed by a dynamic configurable logic which proceeds with predetermined processing while suitably making a change in its logical configuration during the operation. FIG. 16(b) shows a structure in which two memory cores (a circuit configuration information storage means and an internal information storage means/control means) 80a and 80b, two register groups 81a and 81b, and two dynamic configurable logics 85a and 85b are provided. A multi-purpose register (shared register) 86 is arranged in order that data communication between the two logics 85a and 85b may be established. Changing in logical configuration is made in an alternating (interleaved) fashion. In the present invention, the number of memory cores used is two. However, the present invention is not limited to such a number.

Since the dynamic configurable logics 85a and 85b are identical in structure, only one of them (the logic 85a) is illustrated with reference to FIG. 17.

Referring to FIG. 17, the dynamic configurable logic 85a has a plurality of unit logics 90, a channel wiring section (channel wire) 91, and a great number of programmable switch elements (switch circuits) 92. The unit logic 90 is a simple AND gate or a functionally equivalent functional block. The channel wiring section 91 has a great number of channel wires that intersect with a great number of leads 93 extending from the unit logics 90.

The programmable switch elements 92 are placed at intersections of the leads 93 and the channel wires of the channel wiring section 91. Each programmable switch element 92 switches between nonconduction state symbolized by a white dot and conduction state symbolized by a black dot, for dynamically making or breaking the connection of a lead 93 and a channel wire according to connection information stored in the memory core (control means) 80a, to interconnect a plurality of unit logics 90 to implement an actual circuit.

Figure 17A:
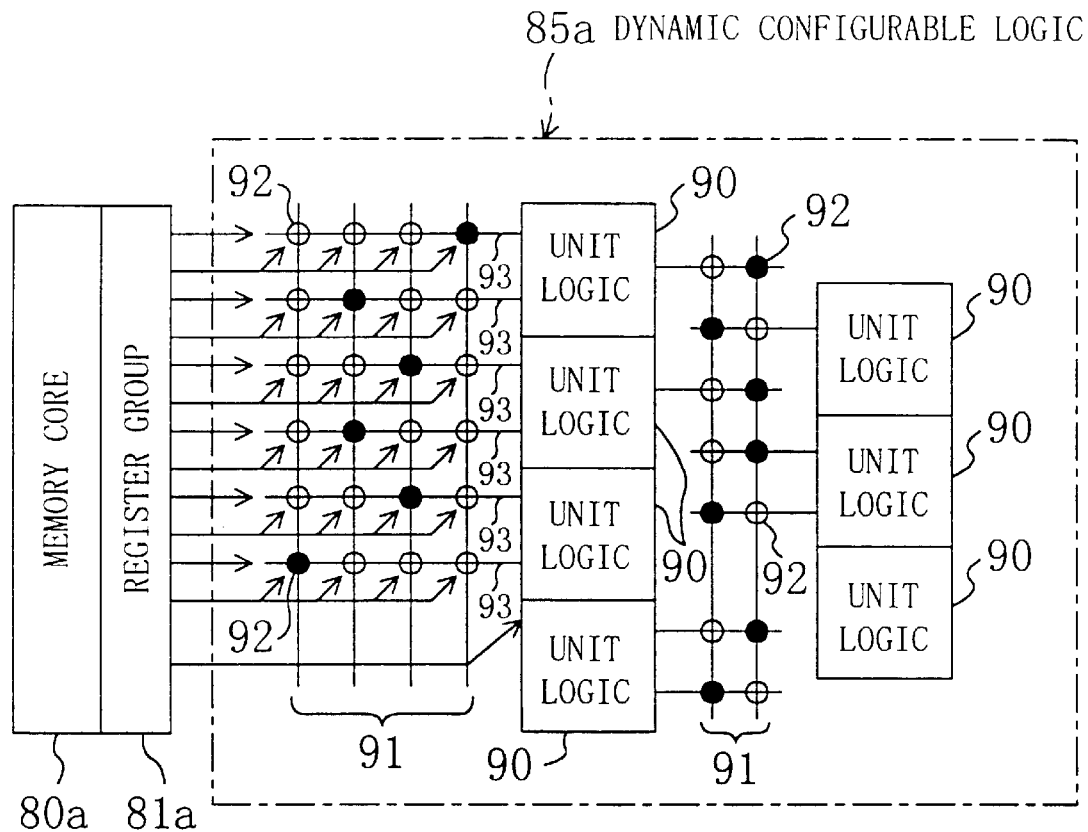
FIG. 17(a) illustrates a dynamic configurable logic for use in a semiconductor integrated circuit of the sixth embodiment of the present invention.
Figure 17B:
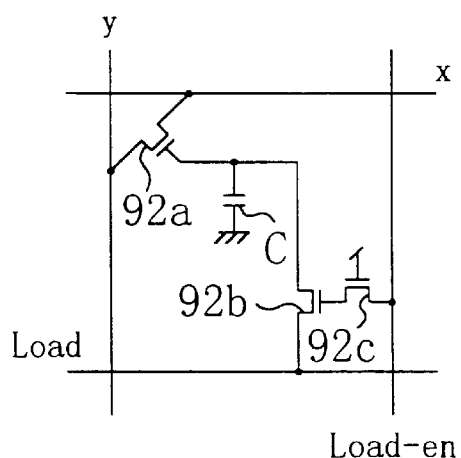
FIG. 17(b) is a diagram showing a structure in which a programmable switch element for use in the dynamic configurable logic of FIG. 17(a) is implemented by a switch element of the dynamic type.
Figure 17C:
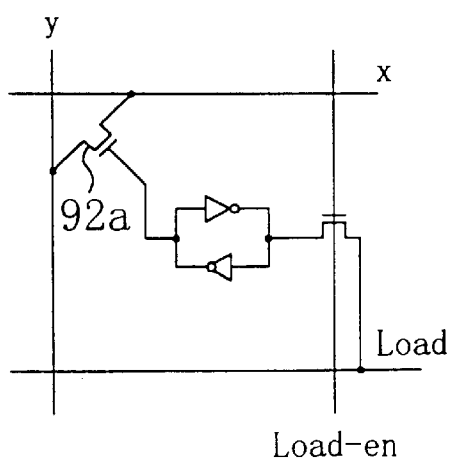
FIG. 17(c) is a diagram showing another structure in which a programmable switch element for use in the dynamic configurable logic of FIG. 17(a) is implemented by a switch element of the static type.

The programmable switch element 92 may be implemented either by a dynamic type switch element making use of a capacitor as shown in FIG. 17(b) or by a static type switch element making use of an SRAM cell as shown in FIG. 17(c). In the figure, x is a lateral wire, y is a vertical wire, and 92a is an n-type MOSFET (connection switch) having a source and a drain coupled to the wires x and y respectively for establishing a connection between the wires x and y. Additionally, arranged between the gate of the NMOSFET 92a and ground (a fixed potential) is a capacitor c. Load is a switch data line (load wire) extending from the memory core. Load-en is a load enable line (load start signal line) for designation of the loading of data to the MOSFET 92a. 92b is a load MOSFET. The gate of the MOSFET 92a and the switch data line Load are connected to the source and drain of the MOSFET 92b, respectively. The gate of the MOSFET 92b is coupled to the source of a self-boot MOSFET 92c. The drain and gate of the MOSFET 92c are coupled to the load enable line Load-en and to a predetermined supply voltage (another fixed potential), respectively.

Having passed through the MOSFET 92a, the signal level of 1 decreases by Vt (the threshold voltage). In order to control a through electric current in the unit logic 90 caused by such a decrease, each of the unit logics 90 uses a voltage that is lower than Vcc (the external supply voltage) by Vt as internal supply voltage.

In the event that programmable switch elements 92 having the above-described structure are employed, connection information to be stored in the switch elements 92 is batch transmitted from the register group 81a to the switch elements 92 (see FIG. 17(a)). Such connection information varies depending on word lines in a memory core.

For the sake of convenience, connection information for each word line is called a sheet. As an image, sheets, each of which is a collection of a certain number of logics, are turned over to realize an entire logic operation. Connection information that is fixed for each sheet is held by data write by memory cell destruction/nondestruction as described previously in the redundancy system. The function of the unit logics 90 is set by information from the register group 81a. The logical value of nodes in each sheet is dynamically stored in the memory core 80a and is read out to the unit logic 90. The memory core 80a serves also as a storage location for temporarily retaining data necessary for the operation of each unit logic 90.

An application of the dynamic configurable logics 85a and 85b is briefly described here.

Consideration is given in order to implement a processing system operable to perform the following processing:

1) a step of inputting data A and B;

2) if A>B, then C=A−B and D=A+B;

3) if A=B, then C=0 and D=1;

4) if A<B, then C=B*A and D=B−A; and

5) C and D (the values found) are summed together and the result is a final output E.

Figure 18:
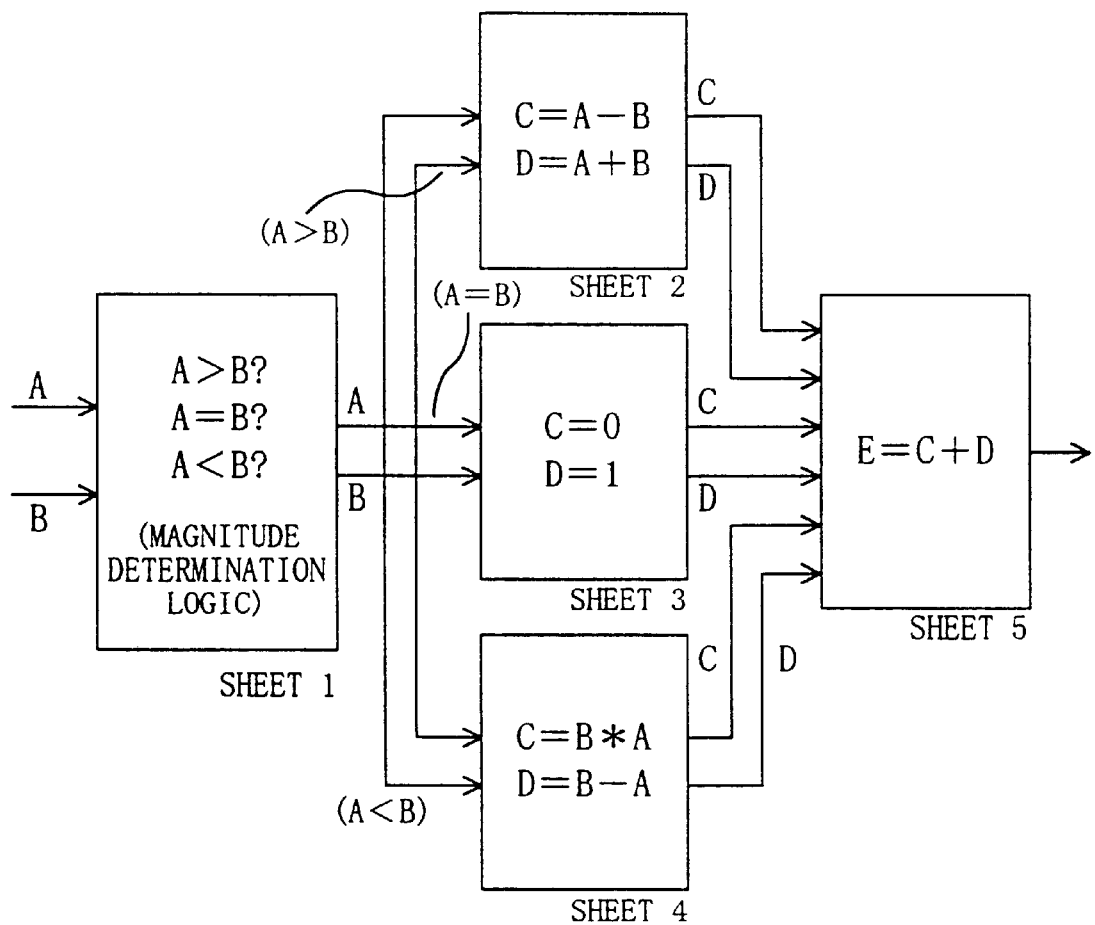
FIG. 18 is a diagram useful in understanding the operation of the sixth embodiment of the present invention.

FIG. 18 schematically shows the above-described processing in a data flow form.

If the processing is carried out using the FIG. 16 organization, the following results.

FIG. 18 shows how the operation flows.

In the first place, connection information for a magnitude determination circuit (sheet 1) stored in the memory core 80 is loaded into the configurable logic 85a. Next, the logic 85a makes a comparison in magnitude between the input data A and B and one of sheets 2, 3, and 4 is loaded to the configurable logic 85a according to the result. At this time, the input data A and B are saved at a multi-purpose register 86 of FIG. 16(b) for a while.

Subsequently the processing of either the sheet 2, the sheet 3, or the sheet 4 is carried out and the results C and D are stored again in the multi-purpose register 86. Next, circuit information for the sheet 5 is loaded to the configurable logic 85a, the values C and D are processed, and the final output E is provided.

Although an actually existing circuit scale is equivalent to merely a single sheet in the present embodiment, it is possible to realize a circuit equivalent to five sheets. In this case, an available number of sheets corresponds to the number of word lines of the memory core 80. This makes it possible to form a great number of logics in a small area, resulting in realizing large-scale integrated and high-performance semiconductor devices at low costs.

Seventh Embodiment

A seventh embodiment of the present invention is now described.

In the present embodiment, a way of implementing a capacitor for use in memory cores and switches is described.

Figure 19:
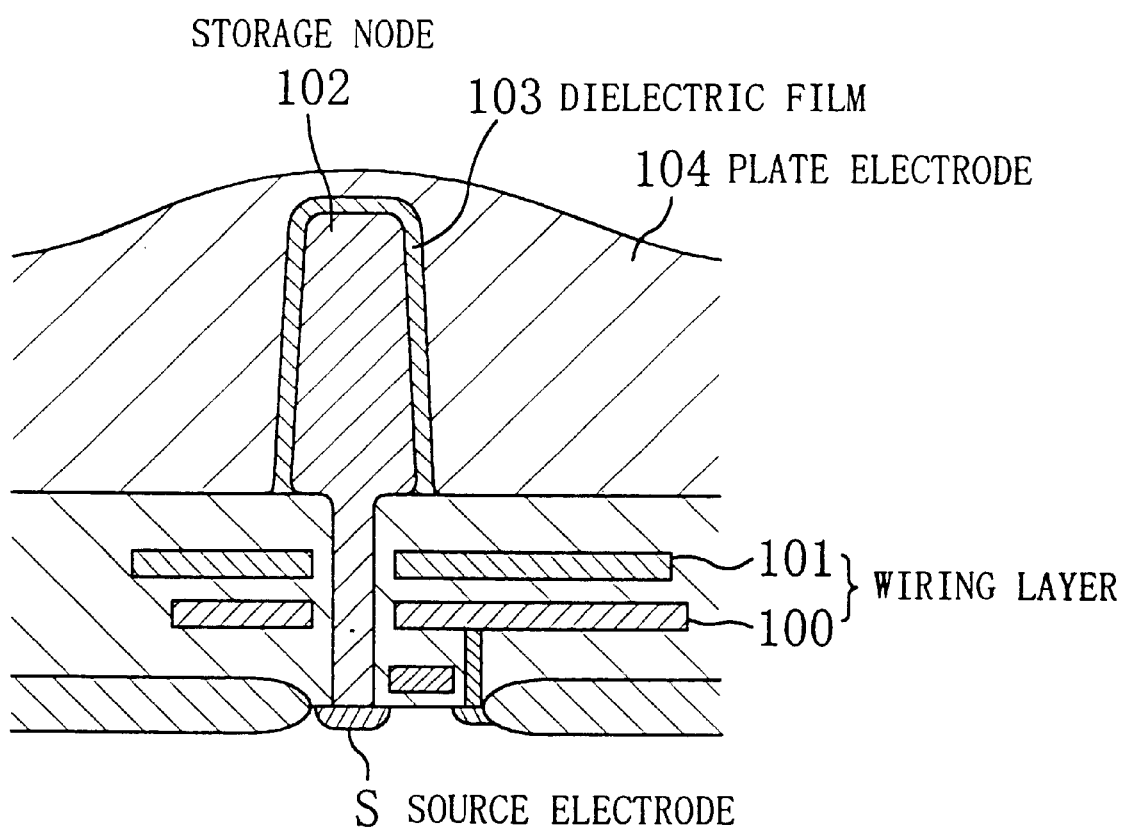
FIG. 19 shows the-structure of a memory cell of a seventh embodiment of the present invention.
Figure 20:
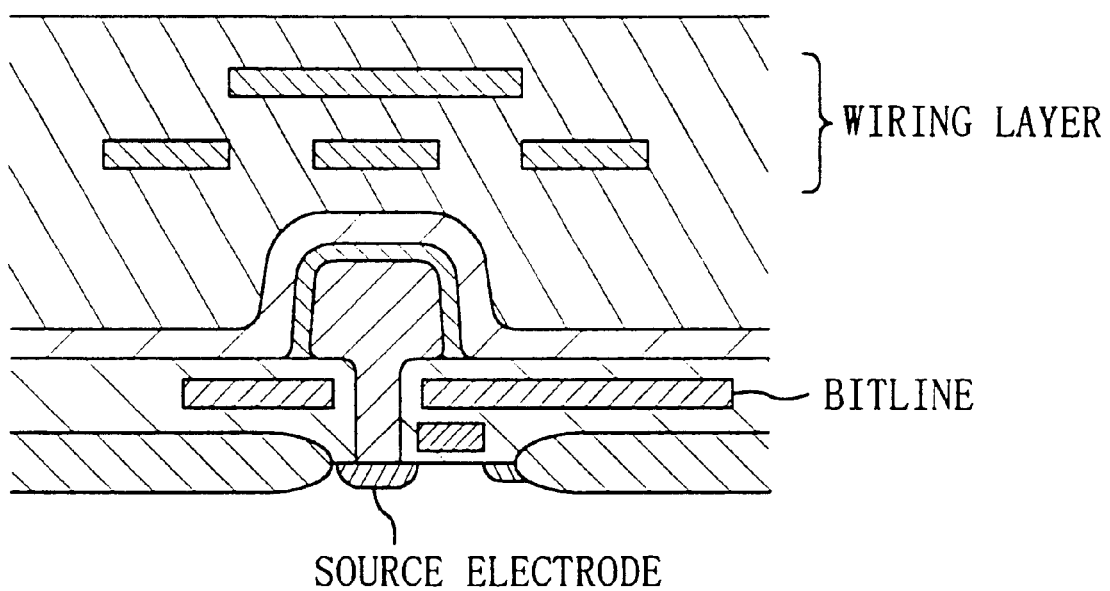
FIG. 20 shows the structure of a conventional memory cell.

FIG. 19 shows in cross section a memory cell of the present embodiment. FIG. 20 shows in cross section a conventional memory cell.

The present embodiment is characterized by the following arrangement (see FIG. 19). As shown in FIG. 19, a transistor source electrode S is drawn up, through a bit line 100 and a global bit line 101 overlying the electrode S, to the uppermost wiring layer where a storage node 102 is formed. A dielectric film 103 is formed overlying the storage node 102. This is followed by formation of a plate electrode 104. The plate electrode 104 of a conductive organic film is formed in the uppermost layer by deposition by spin coating. The plate electrode 104 works to minimize the entry of alpha particle radiation which is a problem in DRAM.

Figure 21:
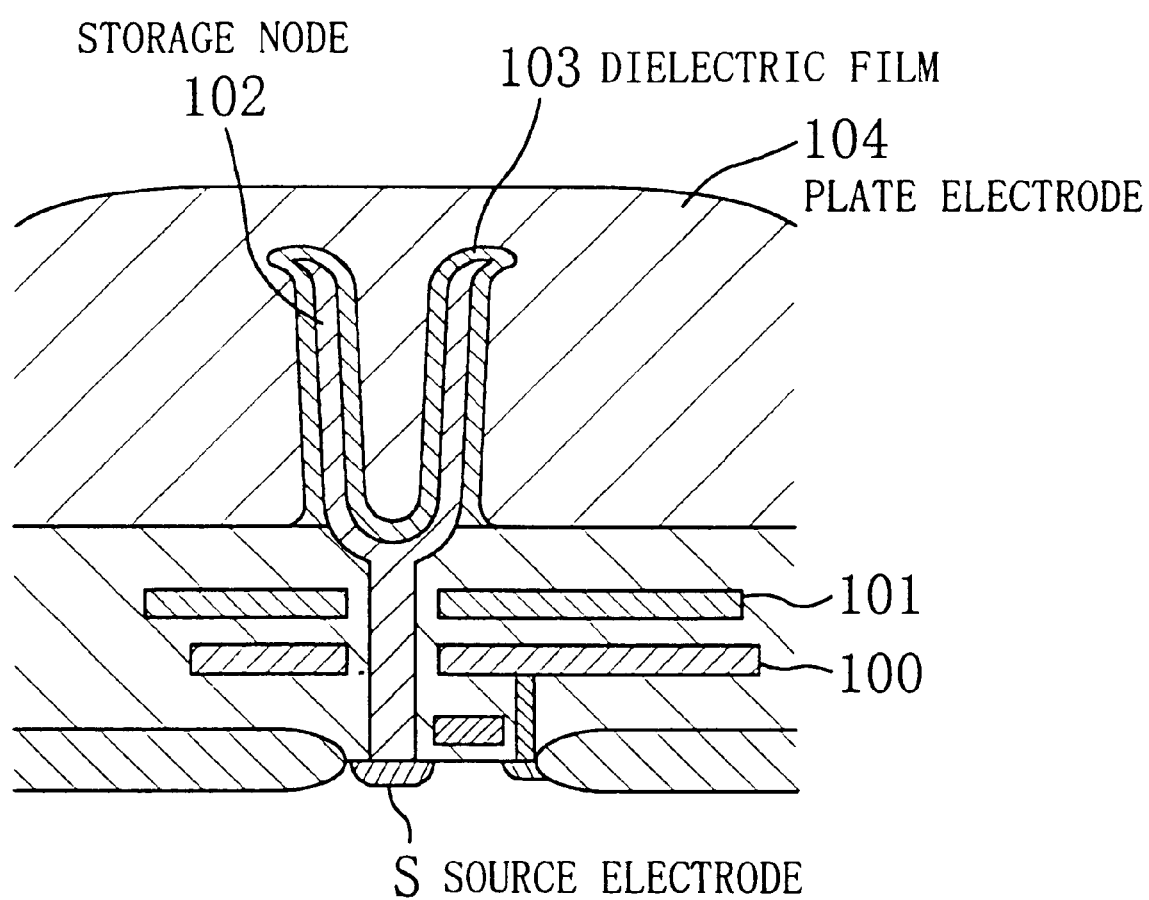
FIG. 21 is a modified form of the memory cell of the seventh embodiment of the present invention.

The storage node 102 may take either a rod-like form shown in FIG. 19 or a tulip-like form shown in FIG. 21. First, a way of forming the storage node 102 in the form of a rod is illustrated. An electrode film is deposited which will become the storage node 102. Subsequently, the electrode film is etched to a rod-like form. The dielectric film 103 is deposited overlying the rod-like electrode film. The plate electrode 104 of a conductive organic film is formed. A way of forming the storage node 102 in the form of tulip is illustrated. A conductive organic film is deposited all over the surface which will become the plate electrode 104. A hole is formed in the film deposited. Subsequently, a storage node electrode is deposited thin all over the surface. The storage node electrode 102 is formed by etching in a tulip-like form. Subsequently, the dielectric film 103 is deposited all over the surface of the storage node 102. This is followed by forming the plate electrode 104 of a conductive organic film. As can be seen from FIGS. 19 and 21, the tulip-like storage node 102 requires more complicated fabrication steps but provides a greater capacitor capacitance.

Both the foregoing memory cells differ from the FIG. 20 conventional one in which wiring layers are located above the storage node 102. Since memory cell formation is carried out after all process steps including wiring are completed, this gives an advantage over prior art technologies in cases where the plate electrode 104 is required to be formed of electrode material very difficult to process such as platinum. The reason of why such a memory cell can be realized is as follows. A technique is employed wherein memory cells are placed at all bitline-wordline intersections, as a result of which bit lines are sparsely placed in comparison with a prior art technique thereby facilitating upward node expansion.

Additionally, if the plate electrode 104 is formed of a conductive organic film which contains a material capable of absorbing alpha particles, a cause of soft errors, such as conductive polyimide or conductive polyethylene and has a film thickness of 3 $\mu$m or more, if provides an improvement in the reliability of semiconductor memories.

Eighth Embodiment

An eighth embodiment of the present invention is now described. The present embodiment is directed to a technique for use in packaging a semiconductor integrated circuit of the present invention.

In the present embodiment, a 64-megabit SDRAM, developed using a memory core of the present invention, is packaged in a form of an extremely small memory module and is mounted onto a PC mother board. In this technique, semiconductor packages are almost a memory module (DIMM (Dual-In-Line Memory Module)).

Figure 22A:
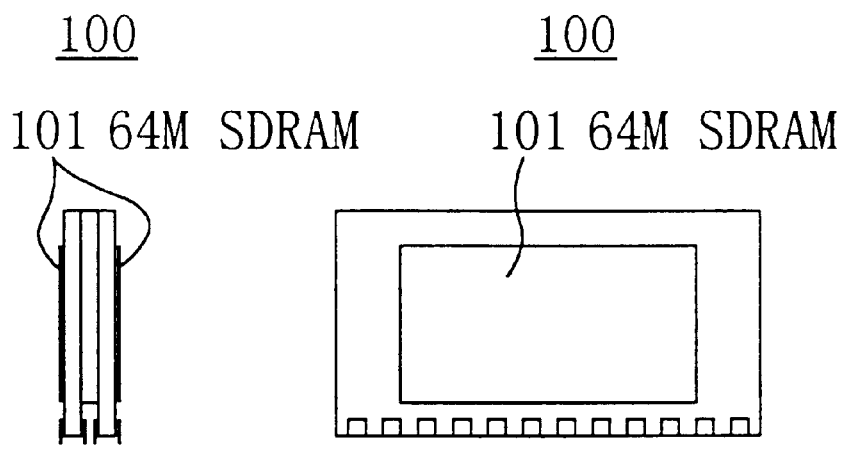
FIG. 22(a) outlines the structure of a memory module of an eighth embodiment of the present invention and FIG. 22(b) illustrates connector forms of the memory module of FIG. 22(a)
Figure 22B:
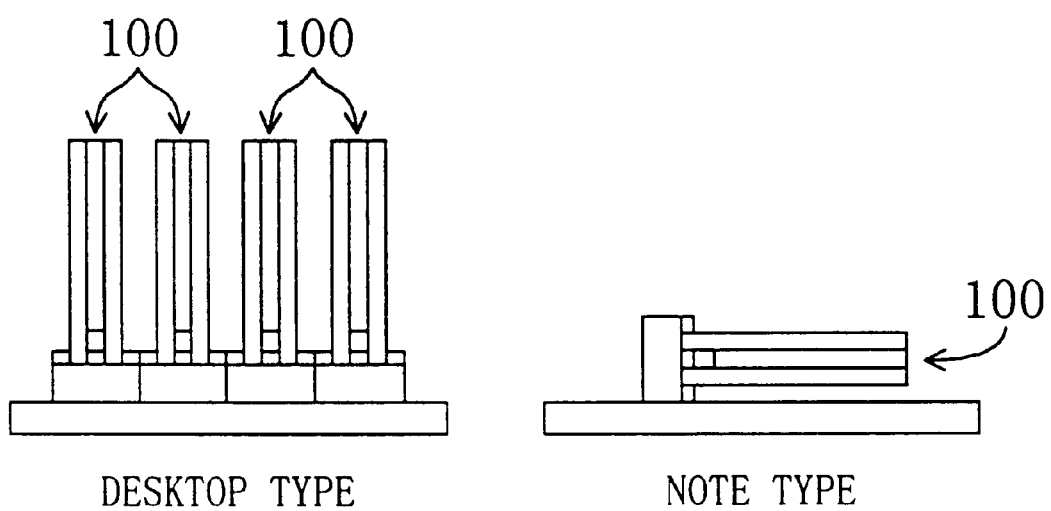
Figure 23:
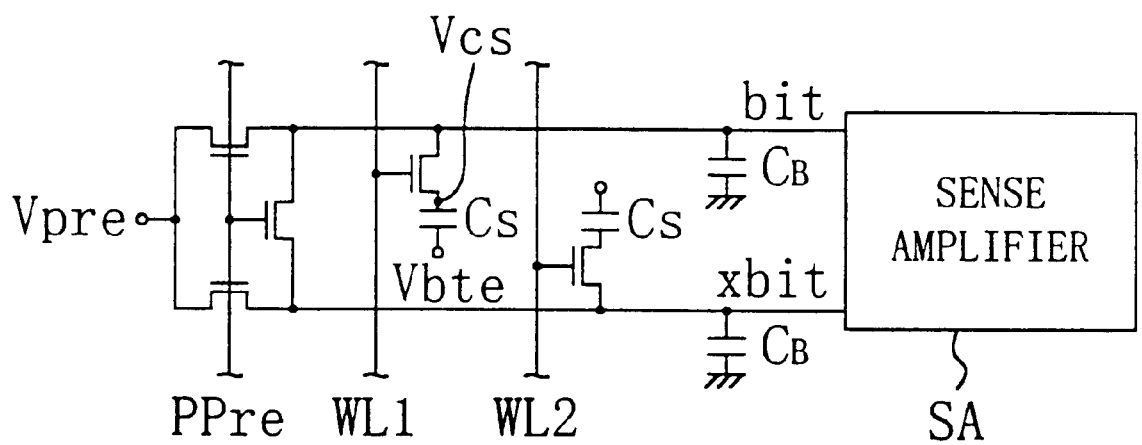
FIG. 23 shows the structure of a conventional DRAM memory core.
Figure 24:
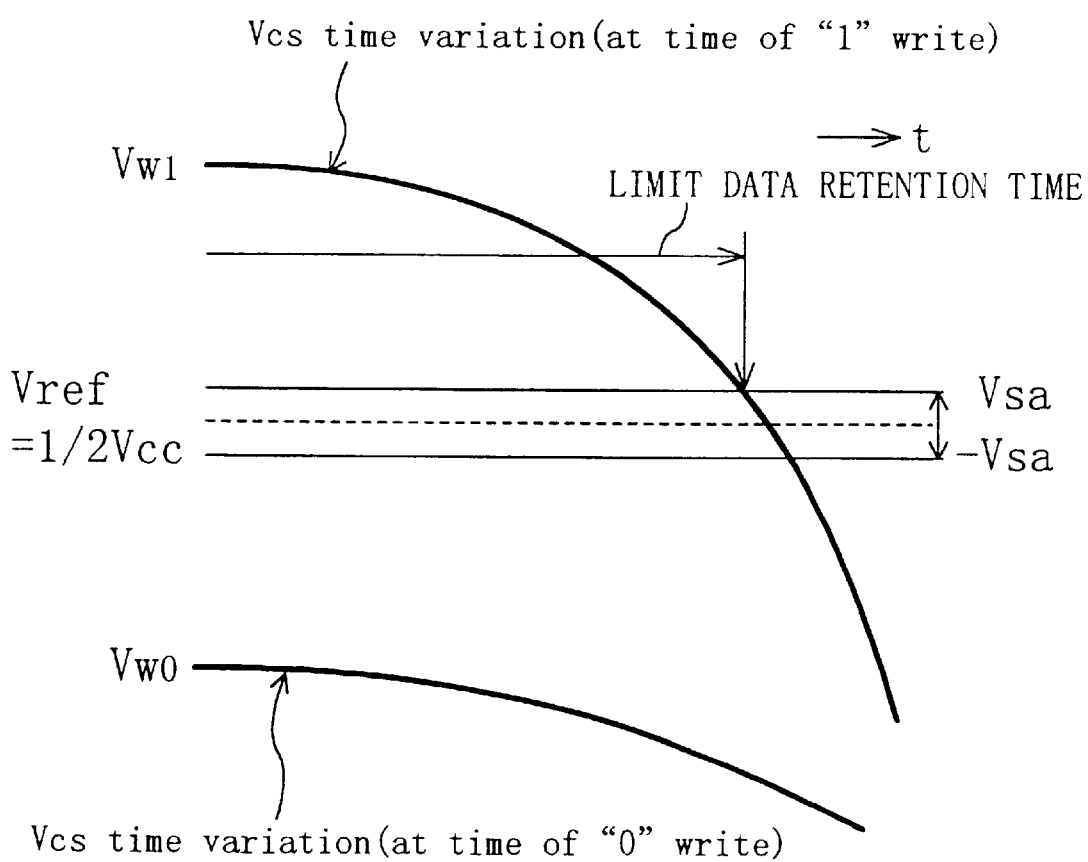
FIG. 24 is a diagram useful in understanding the characteristics of the data retention time of the conventional DRAM memory core.

FIG. 22(a) depicts in cross section the structure of a memory module. FIG. 22(b) depicts the form of a connector corresponding to the memory module.

100 is an extremely small memory module. This memory module 100 employs two 64-megabit chips 101 of the x32 configuration. These chips 101 are packaged by MCM technology in order that they may be sandwiched between 4-layer printed boards. This structure provides a 2-row connector form thereby making it possible to realize a DIMM structure with about 200 pins (dimensions: about 3 cm in length; about 3 mm in thickness).

The present structure makes it possible to reduce the length of memory wiring arranged over a PC mother board thereby allowing data to communicate between memory and logic chip at high speed. A dumping resistor for SSTL is placed in the connector.

The foregoing memory module extremely small in size can find applications in both note PCs and desktop PCs thereby realizing low prices.

Ninth Embodiment

A ninth embodiment of the present invention is now described.

Figure 25:
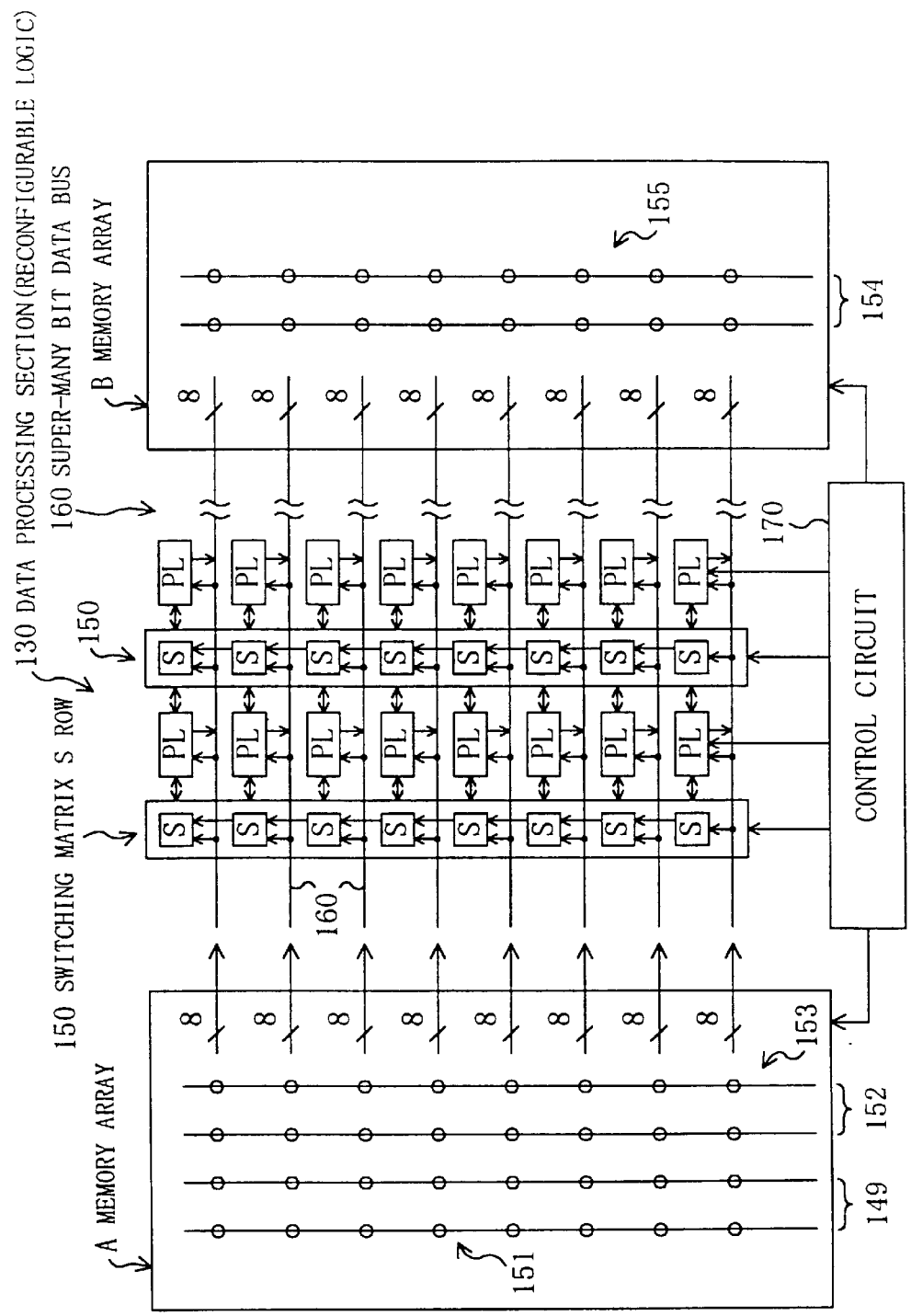
FIG. 25 shows the internal organization of a data processing section of a ninth embodiment of the present invention.

FIG. 25 shows in detail the internal organization of a memory (semiconductor memory) having the function of processing data.

Referring to FIG. 25, a first memory array A having a super-many bit (for example, 1024 bits) data bus 160 and a second memory array B having another super-many bit data bus 160 are disposed. Arranged in an array form between the first and second memory arrays A and B are switching matrix S rows and programmable logics PL. These switching matrix S rows 150 and the programmable logics PL together form a data processing section (a reconfigurable logic which is reprogrammable) 130. This reconfigurable logic may adopt the same organization as the dynamic reconfigurable logic 85a shown in FIG. 17. 170 is a control circuit for controlling the first and second memory arrays A and B, the switching matrix S rows 150, and the programmable logics PL. These components are formed either in a single chip or in a module such as SIMM and DIMM.

In the first memory array A, a first memory cell group 151 is coupled to a first word line group 149 and its many memory cells store data process specification information of the data processing section 130 and a second memory cell group (first region) 153 is coupled to a second word line group 152 and its many memory cells store a group of data items to be processed. In the second memory array B, a third memory cell group (second region) 155 is coupled to a third word line group 154 and its many memory cells are locations for storing results of the data processing.

The switching matrix S row 150 is for data communication with the programmable logic PL and for inter-bit data communication (in the vertical direction in the figure) of the bus 160.

The operation of a memory with a data processing function of the present embodiment is described.

Firstly, data process specification information, stored in the first memory cell group 151, is brought into the data processing section 130 from the first memory array A by way of the super-many bit data bus 160. This process specification information is composed of connection information for the switching matrix S rows 150 and program information for the programmable logics PL. The process specification information is information for, for example, the MPEG2 standard compression/expansion processing carried out in, for instance, DVD apparatus.

Thereafter, data to be processed, stored in the second memory cell group 153, are loaded to the data processing section 130 from the first memory array A. Results of the data processing in the data processing section 130 are stored in the third memory cell group 155 of the second memory array B. Such a series of operations is controlled by the control circuit 170.

Although FIG. 25 shows an organization in which the first and second memory arrays A and B are physically separated from each other, they may not necessarily be separated.

Tenth Embodiment

A tenth embodiment of the present invention is illustrated. This embodiment is directed to an improvement of the FIG. 25 semiconductor memory.

Figure 26:
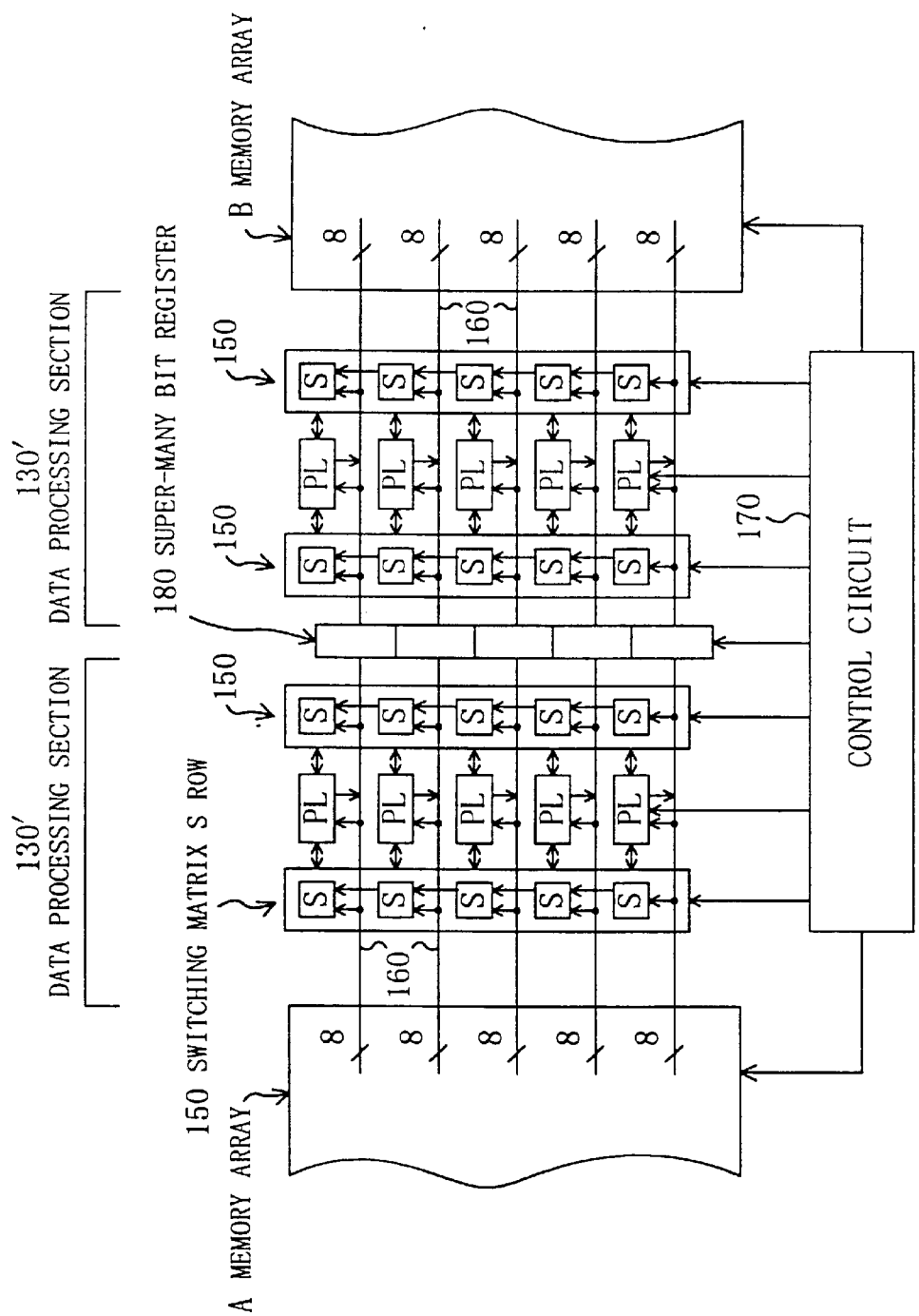
FIG. 26 shows the internal organization of a data processing section of a tenth embodiment of the present invention.

FIG. 26 shows a semiconductor memory with a data processing function of the present embodiment. 180 is a super-many bit register 180. A data processing section 130' is disposed at one side of the super-many bit register 180 and another data processing section 130' is disposed at the other side. Each of the data processing sections 130' is formed of the switching matrix S rows 150 and the programmable logics PL, as in the ninth embodiment.

In the semiconductor memory of the present embodiment, the two data processing sections 130' and 130' are able to independently operate. This makes it possible to seemingly conceal the time taken for loading data process specification information, in other words alternation between two different phases, i. e., Phase 1 in which one data processing section performs a data process operation while the other data processing section performs an information loading process, and Phase 2 in which the one data processing section performs an information loading operation while the other data processing section performs a data processing operation.

Eleventh Embodiment

Finally, an eleventh embodiment of the present invention is illustrated.

Like the tenth embodiment, a semiconductor memory having the function to process data, in which the super-many bit register 180 is placed in the center, is used with a view to achieving more sophisticated dual-port-manner use.

Figure 27:
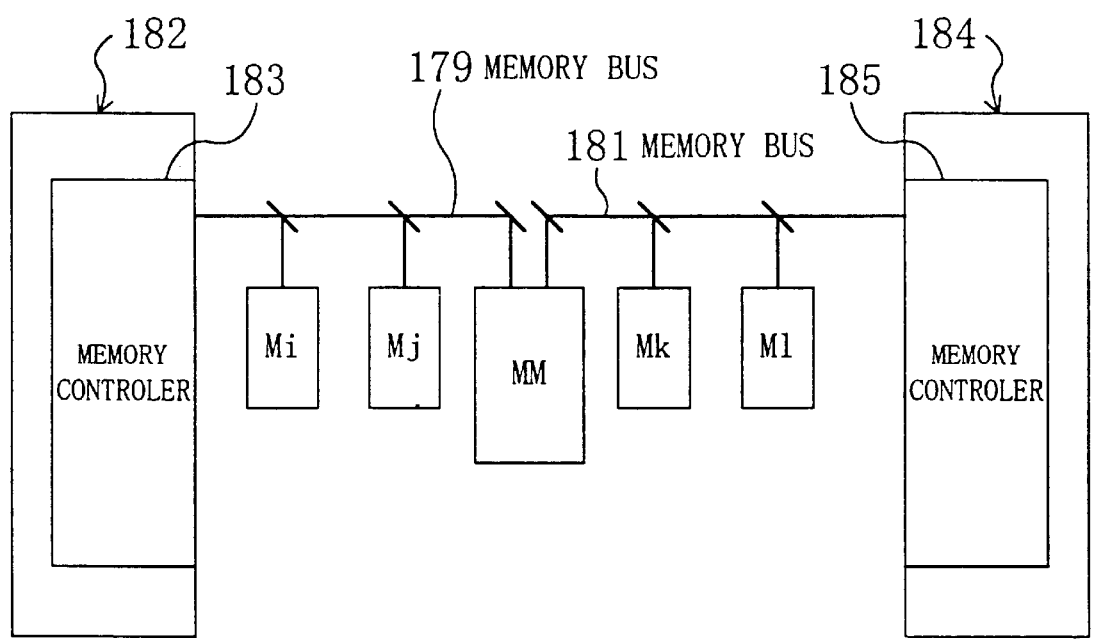
FIG. 27 outlines a computer system of an eleventh embodiment of the present invention.

The term "dual-port-manner use" here means a structure shown in FIG. 27. In such a structure, a memory MM having the function of performing data processing acts as a shared memory between two memory buses 179 and 181 which together form a memory network. Mi and Mj are memories with or without a data processing function that are coupled only to the memory bus 179. The memories Mi and Mj are controlled by a memory controller 183 in a core logic 182. Likewise, Mk and Ml are memories with or without a data processing function that are coupled only to the memory bus 181. The memories Mk and Ml are controlled by a memory controller 185 in a core logic 184.

Figure 28:
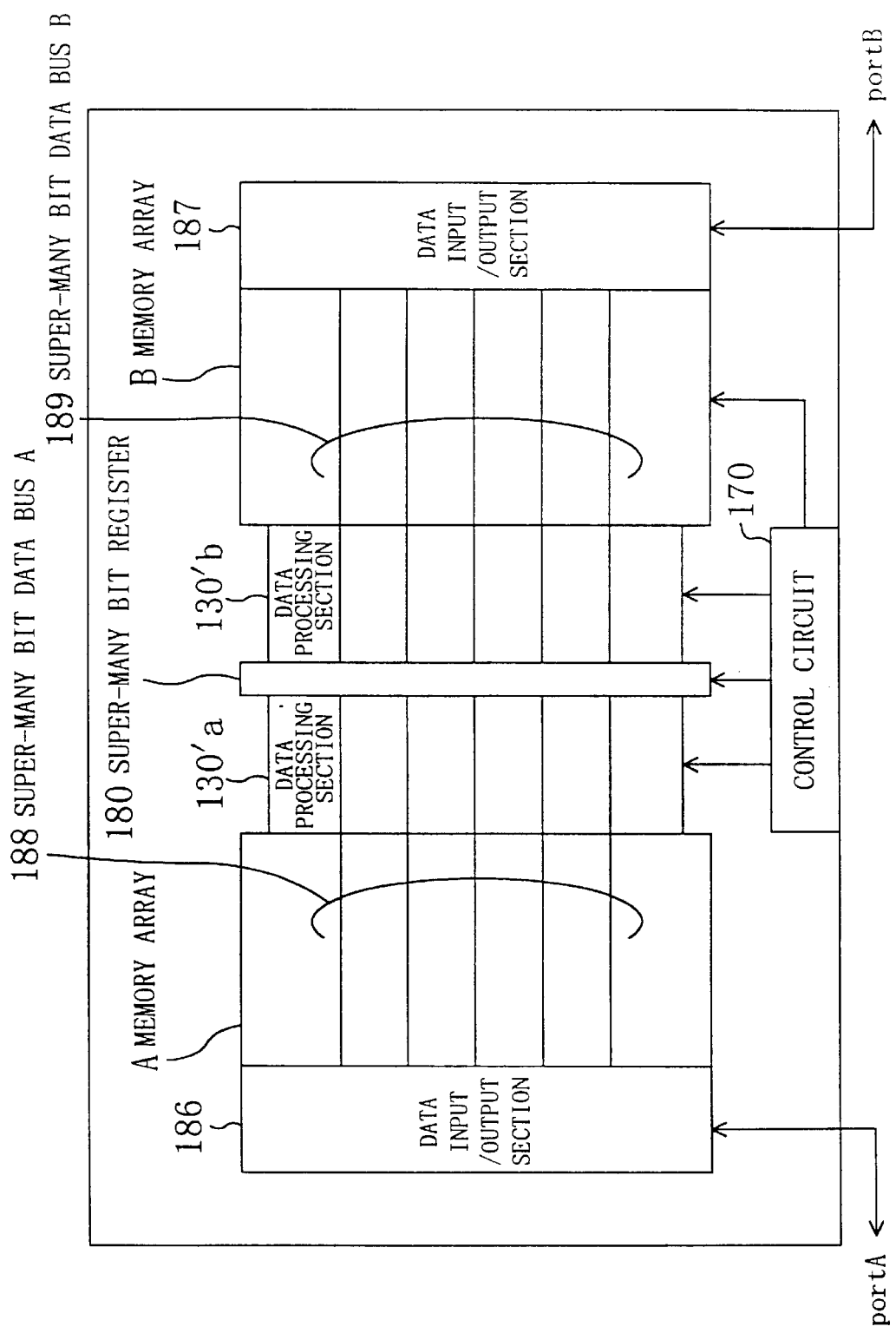
FIG. 28 shows the internal organization of a shared memory having the function of processing data in the eleventh embodiment of the present invention.

Referring to FIG. 28, an internal organization of the memory MM, which has the function to process data, is illustrated. As shown in figure, the super-many bit register 180 is located in the center of the memory MM. Arranged, from inside to outside, on one side of the super-many bit register 180 are a data processing section 130'a, a memory array A, and a data input/output section 186. Likewise, a data processing section 130'b, a memory array B, and a data input/output section 187 are arranged on the other side of the super-many bit register 180. These components are connected by super-many bit data buses 188 and 189.

By virtue of such an organization, communication of data between the two memory buses A and B can be carried out simultaneously with data processing.

What is claimed is:

1. A semiconductor memory having the function of processing data comprising:

at least one dynamically configurable data processing section;

a first group of memory cells, coupled to a first group of word lines, for storing data processing specification information as to said data processing section;

a second group of memory cells, coupled to a second group of word lines, for storing a collection of data to be processed; and a third group of memory cells, coupled to a third group of word lines, for storing processing results;

wherein said data processing section reads in said data collection and said data processing specification information, processes, based on said data processing specification information, said data collection, and stores results of said data processing in said third memory cell group.

2. The semiconductor memory according to claim 1 wherein said data processing section has a reconfigurable logic which is reprogrammable.

3. The semiconductor memory according to claim 1 wherein said data processing section performs compression processing on data read out.

4. The semiconductor memory according to claim 1 wherein said data processing section performs expansion processing on said data read out.

* * * * *